(12) United States Patent
Matsuura et al.

(10) Patent No.: US 8,785,274 B2
(45) Date of Patent: Jul. 22, 2014

(54) METHOD FOR MANUFACTURING SEMICONDUCTOR DEVICE

(75) Inventors: Katsuyoshi Matsuura, Yokohama (JP); Masayoshi Asano, Yokohama (JP); Hiroyuki Ogawa, Yokohama (JP); Myounggoo Lee, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 564 days.

(21) Appl. No.: 12/785,964

(22) Filed: May 24, 2010

(65) Prior Publication Data
US 2010/0304539 A1 Dec. 2, 2010

(30) Foreign Application Priority Data

Jun. 1, 2009 (JP) ................................. 2009-132212

(51) Int. Cl.
*H01L 21/8242* (2006.01)
(52) U.S. Cl.
USPC .................................... 438/253; 257/E21.409
(58) Field of Classification Search
USPC .................................... 438/243; 257/E21.409
See application file for complete search history.

(56) References Cited

U.S. PATENT DOCUMENTS

| | | | | |
|---|---|---|---|---|
| 4,969,022 A | * | 11/1990 | Nishimoto et al. | 257/301 |
| 5,155,059 A | * | 10/1992 | Hieda | 438/155 |
| 5,859,451 A | * | 1/1999 | Narita | 257/306 |
| 6,078,073 A | | 6/2000 | Habu et al. | |
| 6,661,043 B1 | * | 12/2003 | Huang et al. | 257/243 |
| 2004/0137667 A1 | * | 7/2004 | Ogawa et al. | 438/142 |
| 2004/0150025 A1 | * | 8/2004 | Ogawa et al. | 257/301 |
| 2004/0155289 A1 | * | 8/2004 | Murata et al. | 257/335 |
| 2005/0085038 A1 | * | 4/2005 | Tu | 438/257 |
| 2005/0189609 A1 | * | 9/2005 | Tu | 257/510 |
| 2005/0190598 A1 | * | 9/2005 | Tu | 365/185.08 |
| 2006/0057803 A1 | * | 3/2006 | Chiang | 438/246 |

(Continued)

FOREIGN PATENT DOCUMENTS

| | | |
|---|---|---|
| JP | 9-107084 A | 4/1997 |
| JP | 3564472 B2 | 9/2004 |

(Continued)

OTHER PUBLICATIONS

Japanese Office Action dated Sep. 17, 2013, issued in corresponding Japanese Patent Application No. 2009-132212, w/ English translation.

*Primary Examiner* — Matthew Landau
*Assistant Examiner* — Igwe U Anya
(74) *Attorney, Agent, or Firm* — Westerman, Hattori, Daniels & Adrian, LLP

(57) ABSTRACT

A method for manufacturing a semiconductor device includes preparing a semiconductor substrate having a first region of a first electrical conduction type as a part of a surface layer of the semiconductor substrate and a first gate electrode and a capacitor structure, the first gate electrode and the capacitor structure being disposed on the first region; forming a first insulating film covering the first gate electrode and the capacitor structure, the first insulating film being covering the surface of the semiconductor substrate; implanting a first impurity of a second electrical conduction type into the semiconductor substrate, so as to form a region of the second electrical conduction type in each of a second region and a third region, the second region being a region between the first gate electrode and the capacitor structure, the third region being a region opposite to the capacitor structure with the first gate electrode therebetween.

15 Claims, 20 Drawing Sheets

(56) References Cited

U.S. PATENT DOCUMENTS

| | | | |
|---|---|---|---|
| 2006/0094229 A1* | 5/2006 | Ema et al. | 438/624 |
| 2006/0134874 A1* | 6/2006 | Kamiya | 438/305 |
| 2007/0034872 A1* | 2/2007 | Leonardi et al. | 257/59 |
| 2007/0164339 A1* | 7/2007 | Asano et al. | 257/296 |
| 2008/0185635 A1* | 8/2008 | Yanagi et al. | 257/325 |
| 2008/0224197 A1 | 9/2008 | Ito | |

FOREIGN PATENT DOCUMENTS

| | | |
|---|---|---|
| JP | 2006-173438 A | 6/2006 |
| JP | 3795634 B2 | 7/2006 |
| JP | 2008-235324 A | 10/2008 |

\* cited by examiner

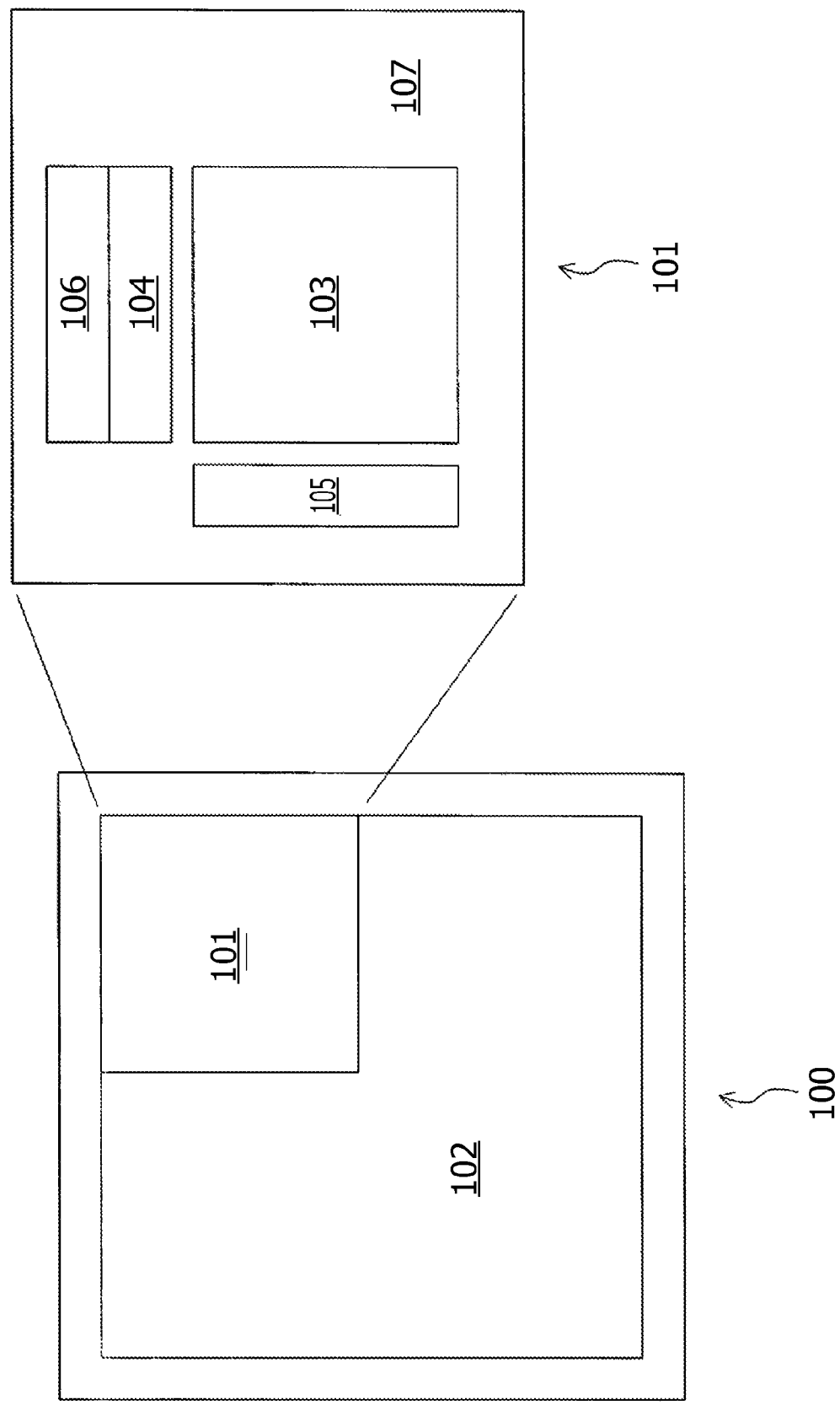

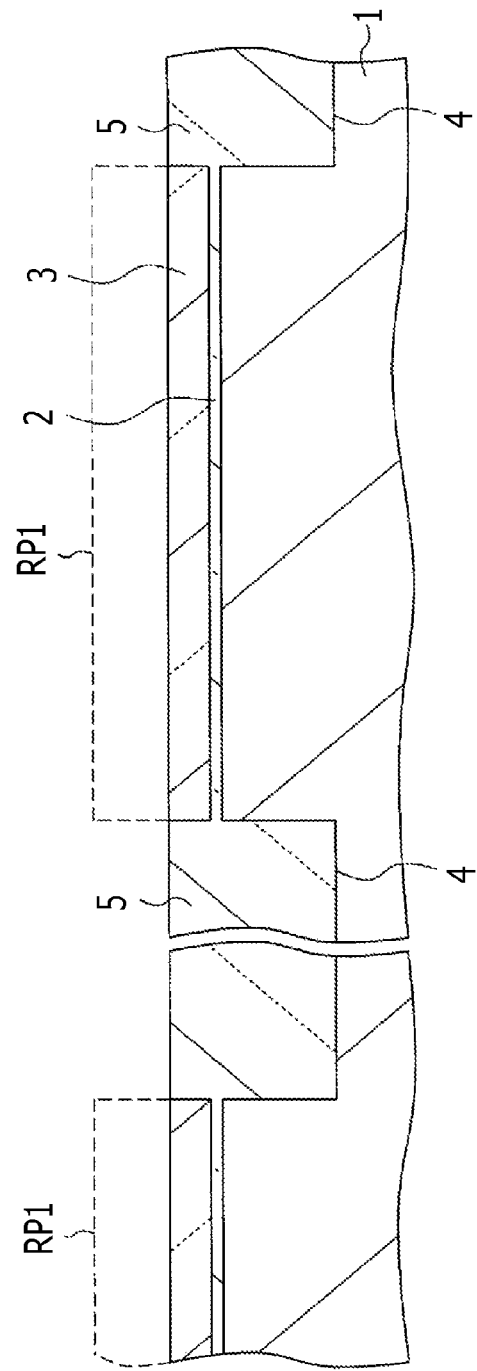
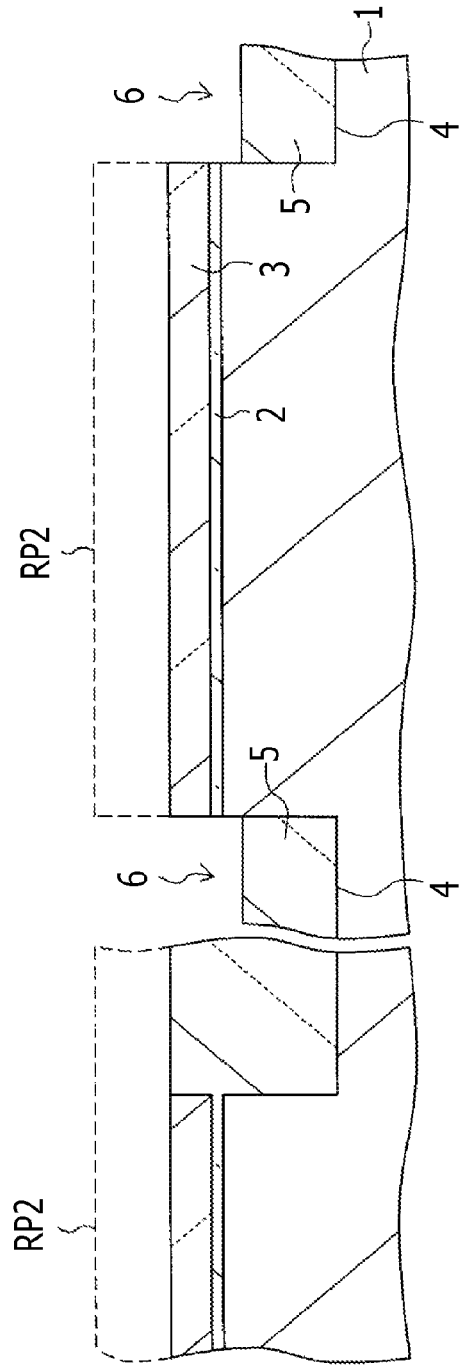
FIG. 4A
FIG. 4B

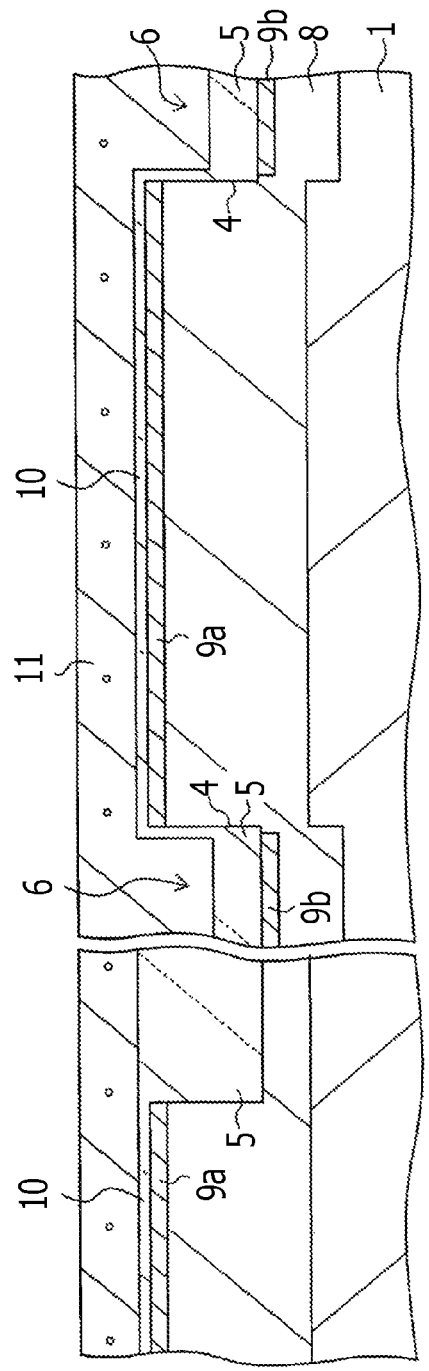
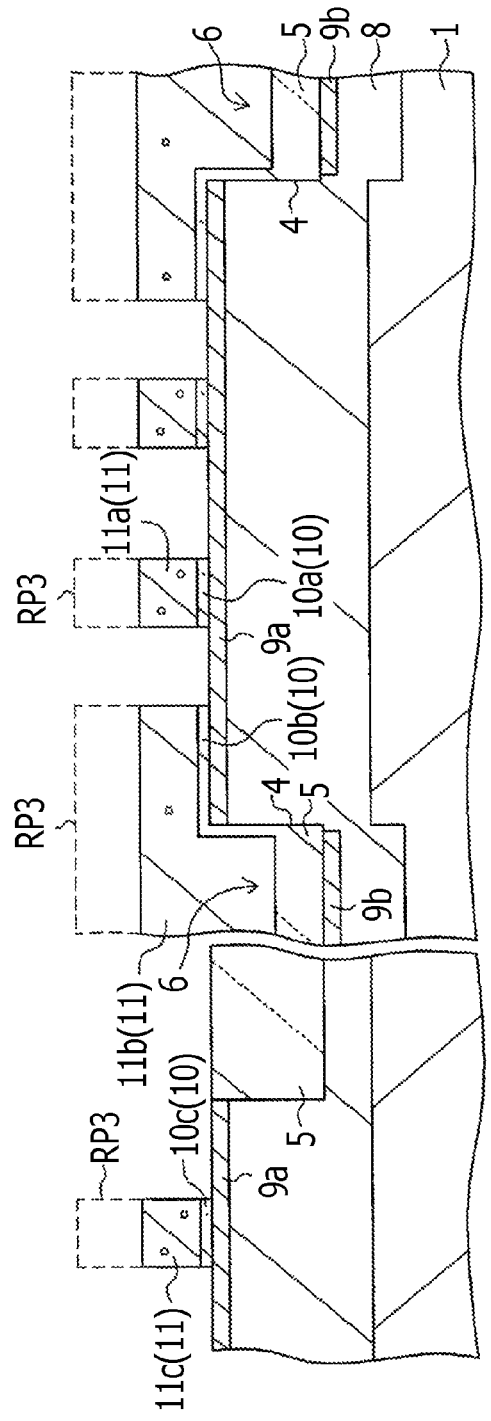

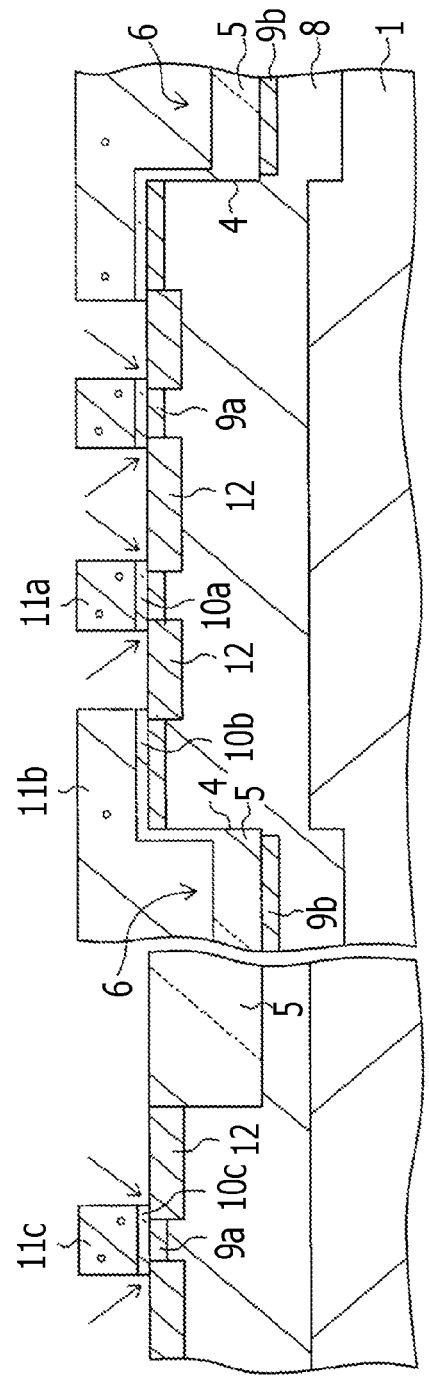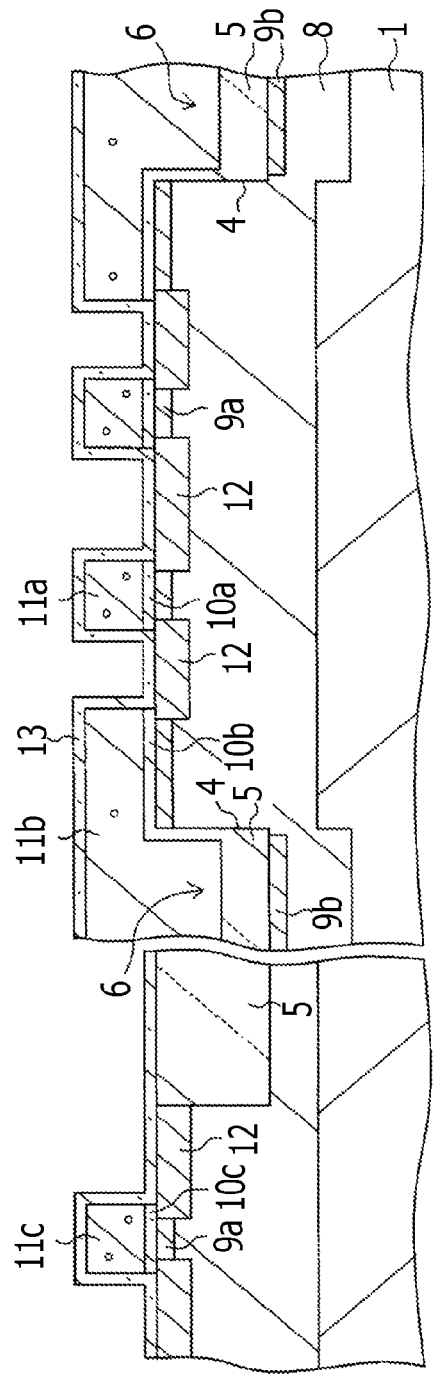

METHOD FOR MANUFACTURING SEMICONDUCTOR DEVICE

CROSS-REFERENCE TO RELATED APPLICATIONS

This application is based upon and claims the benefit of priority of the prior Japanese Patent Application No. 2009-132212, filed on Jun. 1, 2009 the entire contents of which are incorporated herein by reference.

FIELD

The present invention relates to a method for manufacturing a semiconductor device including a memory.

BACKGROUND

A memory cell structure, in which one switching transistor is combined with one capacitor, has been known. For example, such a memory cell structure is formed at the same time with a logic transistor structure and, thereby, a semiconductor memory-merged logic large scale integration (LSI) is produced.

As for a capacitor of a logic-in-memory cell, a capacitor having a structure, in which a cell plate electrode and a semiconductor substrate are disposed oppositely with a capacitor insulating film therebetween, an inversion layer is formed on the semiconductor substrate surface because of a voltage applied to the cell plate electrode, and the resulting inversion layer serves as a charge accumulation region, is used.

Furthermore, an element isolation insulating film of a shallow trench isolation (STI) is dug, and a cell plate electrode is formed entering an element isolation groove, so that active regions of element isolation groove side walls are used as charge accumulation regions and, thereby, the capacity is increased (1TQ structure).

An impurity diffusion layer (storage diffusion layer) on the capacitor side of a switching transistor of the memory cell is connected to the inversion layer of the capacitor and serves as a part of the charge accumulation region. In order to improve the charge retention characteristic of the memory cell, it is desirable to reduce a leakage current through the storage diffusion layer, for example, a junction leakage current. In this regard, if the temperature becomes high (for example, 125° C.), a leakage current through the storage diffusion layer increases significantly.

Consequently, it is difficult to produce a memory cell, in which a leakage current through the storage diffusion layer is suppressed.

SUMMARY

According to one aspect of the invention, a method for manufacturing a semiconductor device includes preparing a semiconductor substrate having a first region of a first electrical conduction type as a part of a surface layer of the semiconductor substrate and a first gate electrode and a capacitor structure, the first gate electrode and the capacitor structure being disposed on the first region; forming a first insulating film covering the first gate electrode and the capacitor structure, the first insulating film covering the surface of the semiconductor substrate; implanting a first impurity of a second electrical conduction type into the semiconductor substrate, so as to form a region of the second electrical conduction type in each of a second region and a third region in the surface layer of the semiconductor substrate, the second region being a region between the first gate electrode and the capacitor structure, the third region being a region opposite to the capacitor structure with the first gate electrode therebetween; and forming first side walls on the first gate electrode by etching the first insulating film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a schematic plan view illustrating a whole structure of a semiconductor device according to an embodiment of the present invention.

DETAILED DESCRIPTION OF THE EMBODIMENTS

Figure 2A:
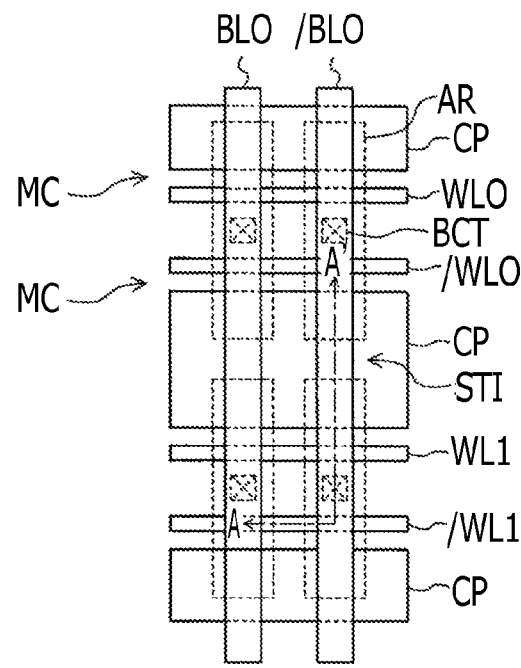
FIG. 2A is a schematic plan view of a layout of a memory cell array according to an embodiment.

Initially, a schematic whole structure of a semiconductor device according to an embodiment of the present invention will be described.

FIG. 1 is a schematic plan view illustrating a chip image of a semiconductor device according to an embodiment. In FIG. 1, the left illustrates a whole structure of a semiconductor substrate 100. The semiconductor substrate 100 is a semiconductor memory-merged logic large scale integration (LSI) and includes a memory circuit 101 and a logic circuit 102. The logic circuit 102 includes, for example, a complementary metal oxide semiconductor (CMOS) inverter chain.

In FIG. 1, the right schematically illustrates the layout of a memory circuit 101. The memory circuit 101 includes a memory cell 103, a sense amplifier 104, a word decoder 105, a column decoder 106, and a peripheral circuit 107.

The word decoder 105 and the column decoder 106 are used as address decoders. A weak signal read from the addressed memory cell 103 is amplified by the sense amplifier 104 to a sufficient level. The peripheral circuit 107 collectively represents circuits other than the memory cell 103, the sense amplifier 104, the word decoder 105, and the column decoder 106 and includes input and output buffers and the like.

FIG. 2A is a schematic plan view illustrating a layout of a memory cell array according to an embodiment. An array with 4 rows and 2 columns is illustrated as a representative. Element isolation insulating films STI of shallow trench isolation (STI), in which an insulating film, e.g., silicon oxide, is filled in the element isolation grooves, mark off active regions AR arranged in 2 rows and 2 columns, each active region AR being slender in the column direction.

A bit line contact BCT is disposed at a center of each active region AR. Two memory cells MC per active region AR are disposed vertically while sharing the bit line contact BCT and sandwiching the bit line contact BCT.

A bit line BL is disposed to pair with a complementary bit line /BL. In FIG. 2A, a pair of bit lines are numbered 0. The bit lines BL and /BL are extended above the adjacent respective columns of active regions AR in the column direction and are connected to bit line contacts BCT of the respective active regions AR.

A word line WL is disposed to pair with a complementary word line /WL. In FIG. 2A, word lines are numbered 0 and 1 on a pair basis. The pair of word lines WL and /WL are disposed vertically while sandwiching the bit line contact BCT and extending across the active regions AR in the row direction.

Cell plate electrodes CP are disposed outside, above and below, the word lines WL and /WL with respect to each bit line contact BCT. These cell plate electrodes CP cover the upper and lower end portions of the active regions AR and extend in the row direction. The cell plate electrode CP below the active regions AR in the upper row also serves as the cell plate electrode CP above the active regions AR in the lower row.

Figure 2B:
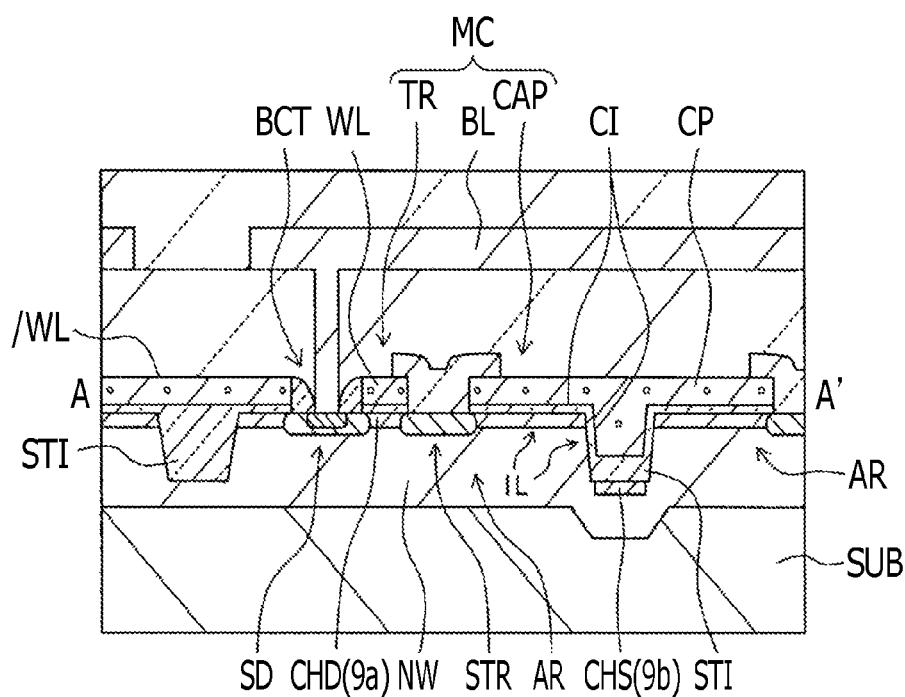
FIG. 2B is a schematic sectional view of the section of a memory cell, taken along an alternate long and short dashed lines A-A' illustrated in FIG. 2A.

FIG. 2B is a schematic sectional view of the section of a memory cell MC, taken along an alternate long and short dashed lines A-A' illustrated in FIG. 2A. A MOS transistor structure TR, in which the word line WL serves as a gate electrode and impurity diffusion layers STR and SD correspond to source/drain regions, is disposed on a semiconductor substrate SUB. In this regard, a channel doping region CHD (9a) and a channel stop region CHS(9b) will be described later.

The bit line BL is connected to the impurity diffusion layer SD and, thereby, the bit line contact BCT is formed. The impurity diffusion layers SD and STR are, for example, p-type impurity diffusion layers formed in n-type wells NW and, therefore, a p-type MOS transistor TR is formed.

The cell plate electrode CP is disposed on the semiconductor substrate SUB with a capacitor insulating film CI therebetween while opposing to the word line WL with the impurity diffusion layer STR therebetween. An application of a predetermined voltage to the cell plate electrode CP forms an inversion layer IL on the surface of the semiconductor substrate SUB. Therefore, charges are accumulated in the inversion layer IL, so that a capacitor CAP based on a laminated structure of the cell plate electrode CP, the capacitor insulating film CI, and the inversion layer IL is formed. For example, an application of a predetermined negative voltage to the cell plate electrode CP inverts the surface of the n-type well NW, so that positive charges are accumulated.

In this manner, a memory cell MC is formed, in which the MOS transistor TR serves as a switching transistor and charges are accumulated in the capacitor CAP, so as to hold information.

The cell plate electrode CP is formed over the adjacent active regions AR while being shared by the adjacent memory cells MC. An element isolation insulating film STI is disposed under the cell plate electrode CP between the adjacent active regions AR.

The element isolation insulating film STI under the cell plate electrode CP is dug in such a way as to leave a part of the thickness, and the cell plate electrode CP is disposed while entering the element isolation groove. Consequently, the inversion layer IL is also formed on the side walls of the element isolation groove, so that an increase in capacity of the capacitor is facilitated. The insulating film having a thickness required for electrically isolating the adjacent memory cells MC from each other is left on the bottom of the element isolation groove.

As described above, an isolation-combined type capacitor structure is formed, in which the element isolation groove side walls are also used as the capacitor and, in addition, adjacent memory cells are electrically isolated from each other by the insulating film left on the element isolation groove bottom.

The impurity diffusion layer (storage diffusion layer) STR connected to the capacitor CAP has a high impurity concentration as compared with that of the region for forming the inversion layer IL, and leakage of current occurs easily. In order to improve the charge retention characteristic of the memory cell MC, it is particularly desirable to reduce a leakage current through the storage diffusion layer STR.

Next, a method for manufacturing a semiconductor device according to an embodiment will be described. The case where a switching transistor of a memory cell is formed from a p-type MOS transistor is shown as an example, and steps for producing the memory cell and the p-type MOS transistor of a logic circuit at the same time are described. In this regard, as for the whole production steps of the semiconductor device, the part including steps for producing an n-type MOS transistor is also required. However, as for the part including the steps for producing an n-type MOS transistor, for example, a publicly known technology may be used.

Figure 3:
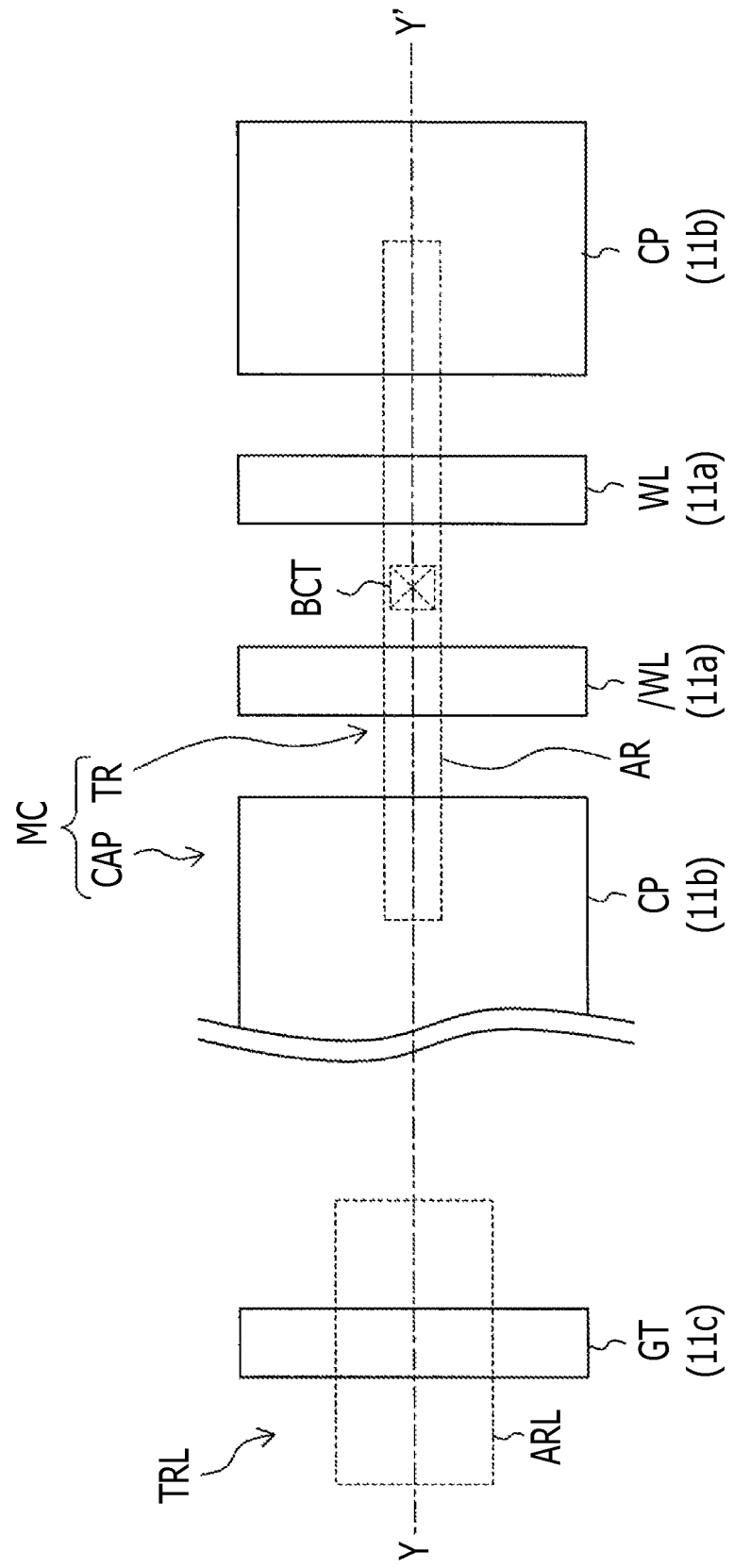
FIG. 3 is a schematic plan view illustrating a memory cell of a memory circuit of a semiconductor device and a transistor of a logic circuit according to an embodiment side by side.

FIG. 3 is a schematic plan view illustrating side by side a memory cell MC of a memory circuit and a p-type MOS transistor TRL of a logic circuit in a semiconductor memory-merged logic LSI according to an embodiment. The p-type MOS transistor TRL of the logic circuit is formed in an active region ARL and has a gate electrode GT. Key steps of the method for manufacturing a semiconductor device according to the embodiment will be described below with reference to the schematic sectional view of the section taken along an alternate long and short dashed line Y-Y' illustrated in FIG. 3.

Initially, as illustrated in FIG. 4A, for example, a p-type silicon semiconductor substrate 1 is prepared. The surface of the silicon substrate 1 is thermally oxidized, so as to form an initial stage silicon oxide film 2. Thereafter, a silicon nitride film ($Si_3N_4$ film) 3 is formed on the initial stage silicon oxide film 2 through, for example, chemical vapor deposition (CVD).

Subsequently, a resist pattern RP1 covering an active region is formed through lithography. The silicon nitride film 3 is etched through dry etching by using the resist pattern RP1 as a mask, so as to form a hard mask. The silicon substrate 1 is etched by using the resulting hard mask as a mask. An element isolation groove 4 having a depth of, for example, about 300 nm is formed in the silicon substrate 1. The depth of the element isolation groove 4 contributes to a capacitor capacity and may be changed appropriately.

Then, the resist pattern RP1 (if it remains) is removed by an ashing treatment or the like. Next, the element isolation groove 4 is filled by accumulating, for example, silicon oxide through, for example, high-density plasma (HDP) CVD, so as to form an element isolation insulating film 5. Thereafter, chemical mechanical polishing (CMP) is conducted by using the silicon nitride film 3 as a stopper, so that the element isolation insulating film 5 is left in the element isolation groove 4. In this manner, the element isolation insulating film 5 of the STI is formed.

Subsequently, as illustrated in FIG. 4B, a resist pattern RP2 having openings in regions, in which the element isolation insulating film 5 in the memory circuit is dug and etching is conducted, is formed through lithography. Then, the element isolation insulating film 5 is removed while a part of the thickness, for example, about 130 nm from the bottom of the element isolation groove 4 is left through dry etching by using the resist pattern RP2 as a mask, so as to form capacitor trenches 6. Thereafter, the resist pattern RP2 is removed by an ashing treatment or the like.

Figure 4C:
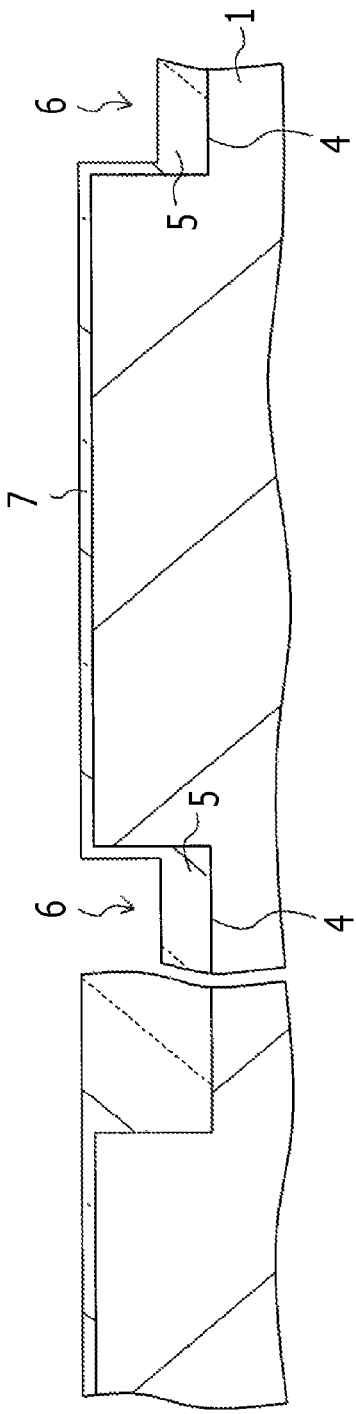
FIGS. 4A to 4Q are schematic sectional views illustrating key steps of a method for manufacturing a semiconductor device according to an embodiment.

Next, as illustrated in FIG. 4C, the silicon nitride film 3 and the initial stage silicon oxide film 2 are removed through wet etching. As for an etching solution, for example, a phosphoric acid solution or a hydrofluoric acid solution is used. Thereafter, the surface of the silicon substrate 1 is thermally oxidized, so as to form a silicon oxide film 7 serving as a protective film in a down stream ion implantation step is formed having a thickness of, for example, 10 nm.

Figure 4D:
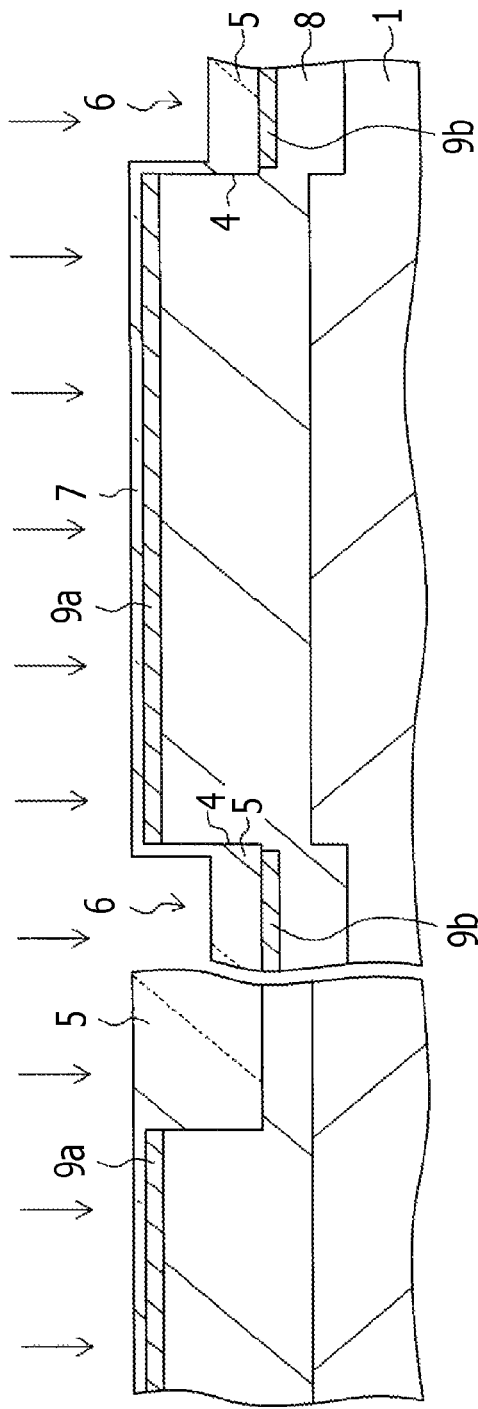

Subsequently, as illustrated in FIG. 4D, ion implantation of an n-type impurity is conducted, so as to form a channel stop region 8 also serving as an n-type well. As for the ion implantation condition, for example, phosphorus (P) is used as the n-type impurity, the acceleration energy is specified to be 360 keV, and the dosage is specified to be $3.0 \times 10^{13}/cm^2$. The ion implantation condition has an influence on the element isolation capability of the resulting semiconductor device and may be changed appropriately in accordance with the depth of the element isolation groove 4.

In this regard, this ion implantation is conducted by forming a resist pattern having openings in a transistor region and a capacitor region of the memory circuit and the p-type MOS transistor region of the logic circuit through lithography and using the resulting resist pattern as a mask. After the ion implantation, the resist pattern is removed by an ashing treatment or the like.

In the regions for forming the capacitor trenches 6, the n-type well and the channel stop region 8 are formed at locations deeper than those of the other regions by the amount of digging of the element isolation insulating film 5. In this regard, in the production process, implantation into the well may be conducted before the capacitor trenches 6 are formed.

Then, ion implantation of the n-type impurity is further conducted, so as to form a channel doping region 9a in an upper layer portion of the active region of the memory circuit and an upper layer portion of the active region of the p-type MOS transistor region of the logic circuit. Furthermore, at the same time with this, a channel stop region 9b is formed under, desirably immediately under, the element isolation insulating film 5 (the element isolation groove 4) in the regions for forming the capacitor trenches 6 of the memory circuit. As for the ion implantation condition, for example, arsenic (As) is used as the n-type impurity, the acceleration energy is specified to be 100 keV, and the dosage is specified to be $1.5 \times 10^{12}/cm^2$.

In this regard, this ion implantation is conducted by forming a resist pattern having openings in the transistor region and the capacitor region of the memory circuit and the p-type MOS transistor region of the logic circuit through lithography and using the resulting resist pattern as a mask. After the ion implantation, the resist pattern is removed by an ashing treatment or the like. In this connection, the same resist pattern as that in the formation of the channel stop region 8 also serving as the n-type well may be used.

Next, as illustrated in FIG. 4E, the silicon oxide film 7 is dissolved and removed through wet etching. As for an etching solution, for example, a hydrofluoric acid solution is used.

Subsequently, an insulating film 10 used as a gate insulating film of the switching transistor and a capacitor insulating film of the memory circuit and a gate insulating film of the p-type MOS transistor of the logic circuit is formed. For example, the surface of the silicon substrate 1 is thermally oxidized and, thereby, the silicon oxide film 10 having the thickness of, for example, about 3.6 nm is formed. In this regard, the insulating films may be formed in the transistor region and the capacitor region while having mutually different film thicknesses through thermal oxidation, removal of a part of the oxide film, and another thermal oxidation by a so-called dual gate insulating film process.

Then, an electrically conductive film 11 used as a gate electrode of the switching transistor of the memory circuit, a cell plate electrode serving as an upper electrode of the capacitor, and a gate electrode of the p-type MOS transistor of the logic circuit is formed. For example, a polycrystalline silicon film 11 having a thickness of about 105 nm is accumulated on the silicon oxide film 10 through CVD. The polycrystalline silicon film 11 is formed while entering the capacitor trenches 6.

Next, as illustrated in FIG. 4F, a resist pattern RP3 having the shape of a gate electrode 11a of the switching transistor of the memory cell, a cell plate electrode 11b, and a gate electrode 11c of the p-type MOS transistor of the logic circuit is formed through lithography.

The polycrystalline silicon film 11 and the silicon oxide film 10 are patterned by using the resist pattern RP3, so that the gate electrode 11a and a gate insulating film 10a of the switching transistor of the memory cell, the cell plate electrode 11b and the capacitor insulating film 10b, and the gate electrode 11c and the gate insulating film 10c of the p-type MOS transistor of the logic circuit are formed at the same time.

Thereafter, the resist pattern RP3 is removed by an ashing treatment or the like. In this regard, impurity implantation for the purpose of reducing the resistance of the gate electrodes 11a and 11c and the cell plate electrode 11b may be conducted before patterning of the polycrystalline silicon film 11.

Subsequently, as illustrated in FIG. 4G, the gate electrode 11a, the cell plate electrode 11b, and the gate electrode 11c are used as masks, and pocket ion implantation is conducted as measures against punch-through, so as to form pocket regions 12 entering under end portions of the gate electrodes 11a and 11c.

As for the ion implantation condition, for example, phosphorus (P) is used as the n-type impurity, the acceleration energy is specified to be 35 keV, the dosage per time is specified to be $6.10 \times 10^{12}/cm^2$, a wafer is rotated, and 45-degree tilted implantation is conducted from four directions. In this regard, the pocket ion implantation may be conducted while the condition of the transistor of the memory circuit is different from the condition of the transistor of the logic circuit.

Then, as illustrated in FIG. 4H, an insulating film 13 is formed on the silicon substrate 1 while covering the gate electrode 11a, the cell plate electrode 11b, and the gate electrode 11c. For example, the silicon oxide film 13 having a thickness of 15 nm is accumulated through CVD.

Figure 4I:
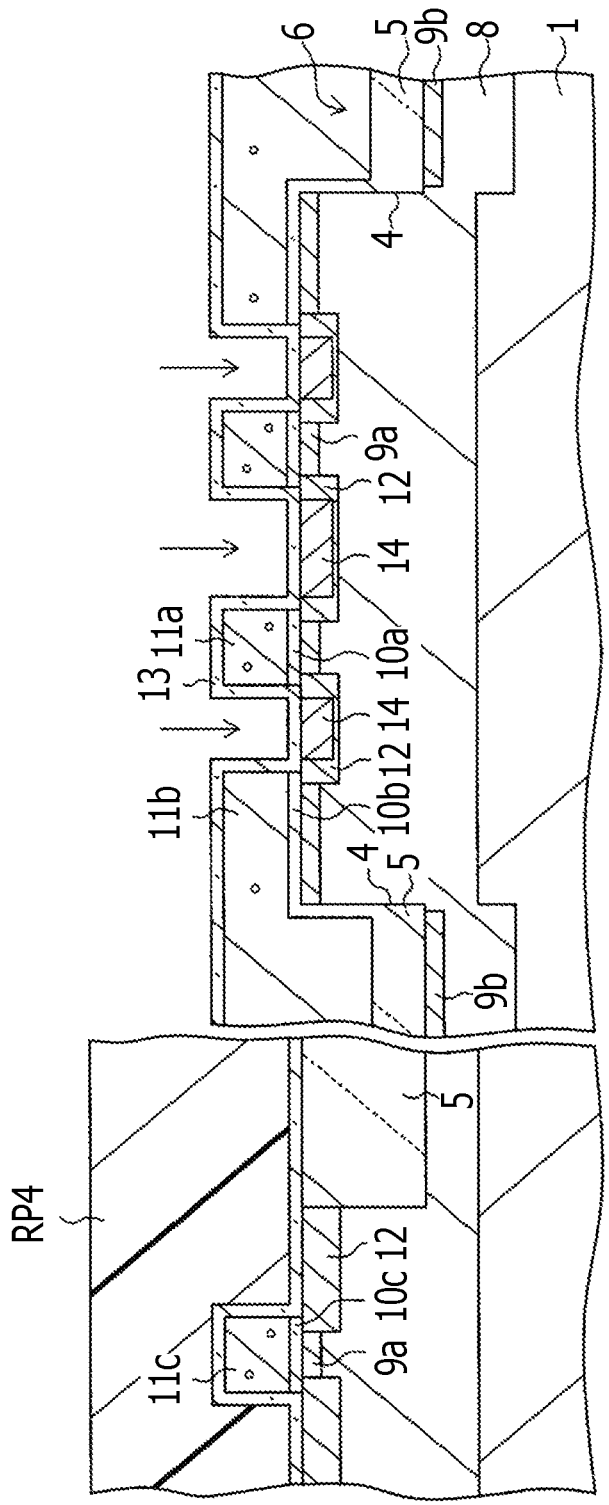

Next, as illustrated in FIG. 4I, a resist pattern RP4 covering the active region (at least the vicinity of both sides of the gate electrode 11c of the p-type MOS transistor) of the logic circuit and having an opening in the active region of the memory circuit is formed on the insulating film 13 through lithography.

The gate electrode 11a, the cell plate electrode 11b, and the resist pattern RP4 are used as masks, and ion implantation of a p-type impurity is conducted through the insulating film 13, so that extension regions 14 are formed as the surface layer of the active regions on both sides of the gate electrode 11a of the memory cell. As for the ion implantation condition, for example, boron (B) is used as the p-type impurity, the acceleration energy is specified to be 5.0 keV, and the dosage is specified to be $4.0 \times 10^{14}/cm^2$.

Figure 4J:
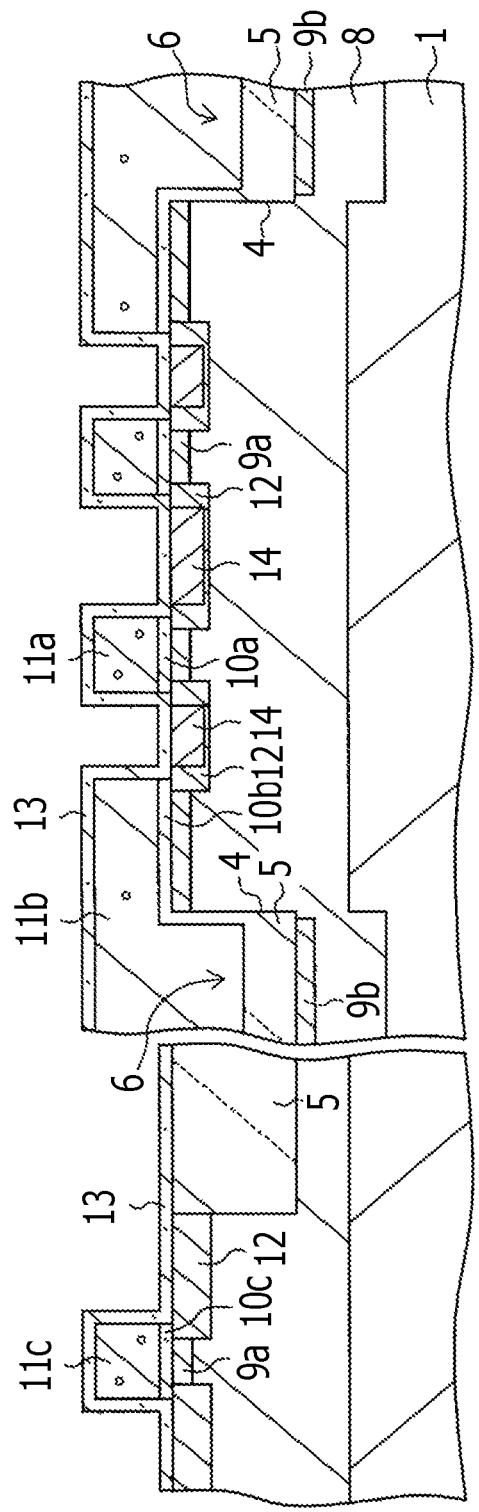

Subsequently, as illustrated in FIG. 4J, the resist pattern RP4 is removed by an ashing treatment or the like. The insulating film 13 under the resist pattern RP4 is exposed.

Figure 4K:
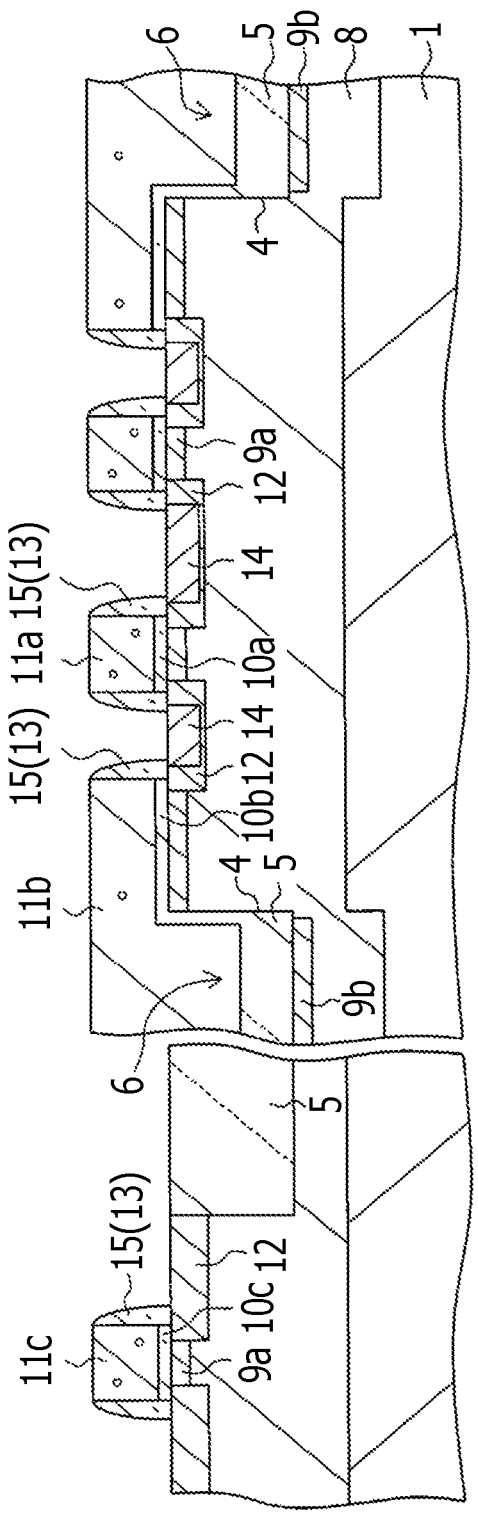

Thereafter, as illustrated in FIG. 4K, the insulating film 13 is etched back through anisotropic etching, e.g., reactive ion etching (RIE), and the insulating film 13 is left on side walls of the gate electrode 11a, the cell plate electrode 11b, and the gate electrode 11c, so that side wall insulating films (side wall spacers) 15 are formed.

Figure 4L:
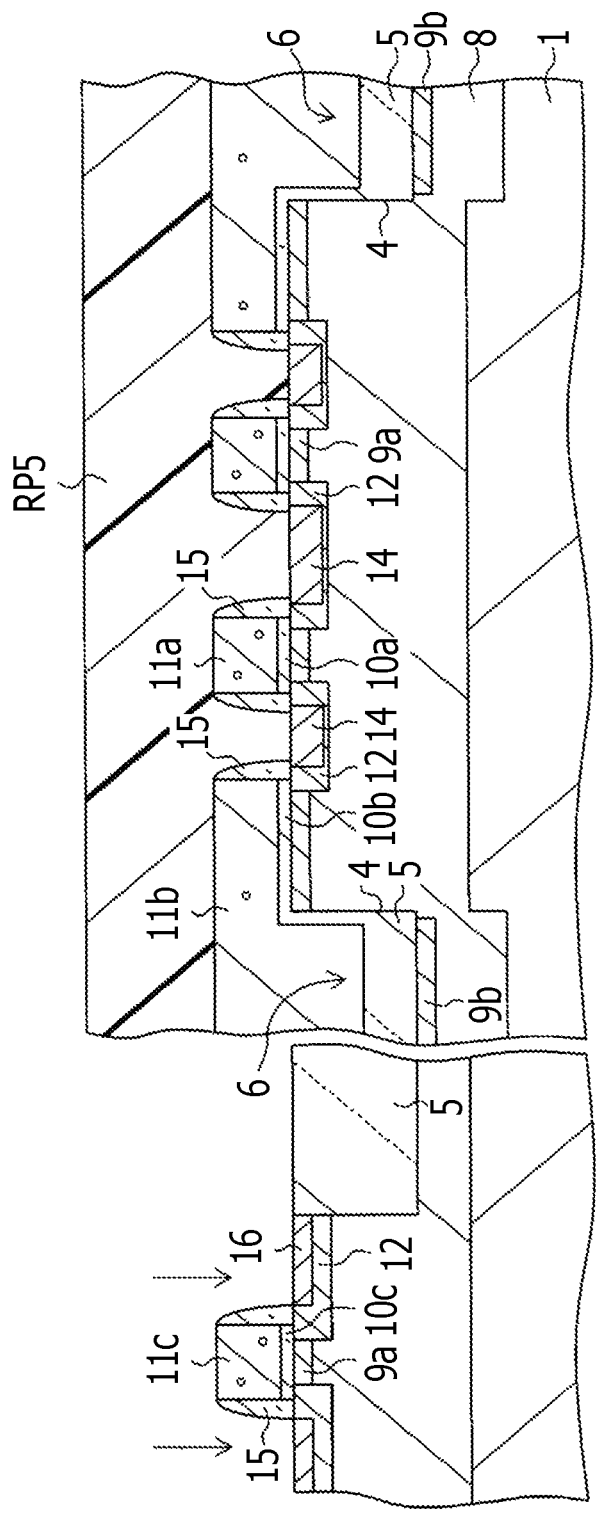

Then, as illustrated in FIG. 4L, a resist pattern RP5 covering the active region (at least the vicinity of both sides of the gate electrode 11a of the switching transistor) of the memory circuit and having an opening in the active region of the p-type MOS transistor of the logic circuit is formed through lithography.

The gate electrode 11c, the side wall insulating films 15 on the side walls thereof, and the resist pattern RP5 are used as masks, and ion implantation of a p-type impurity is conducted, so that extension regions 16 are formed as the surface layer of the active regions on both sides of the gate electrode 11c of the p-type MOS transistor of the logic circuit. As for the ion implantation condition, for example, boron (B) is used as the p-type impurity, the acceleration energy is specified to be 0.5 keV, and the dosage is specified to be $2.0 \times 10^{14}/cm^2$.

Figure 4M:
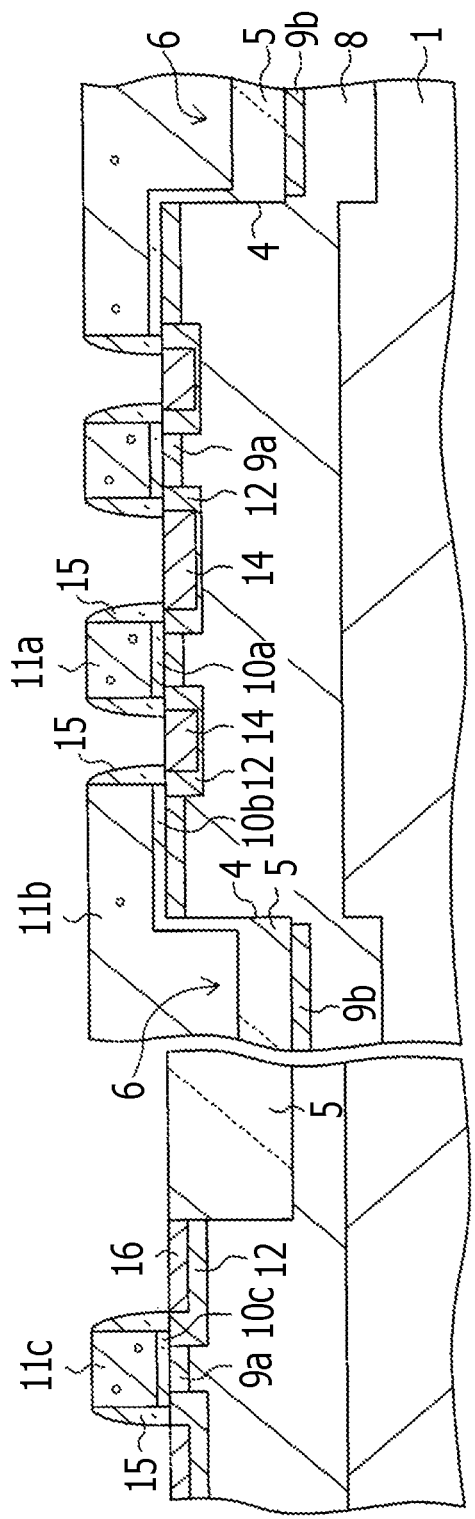

Next, as illustrated in FIG. 4M, the resist pattern RP5 is removed by an ashing treatment or the like.

Figure 4N:
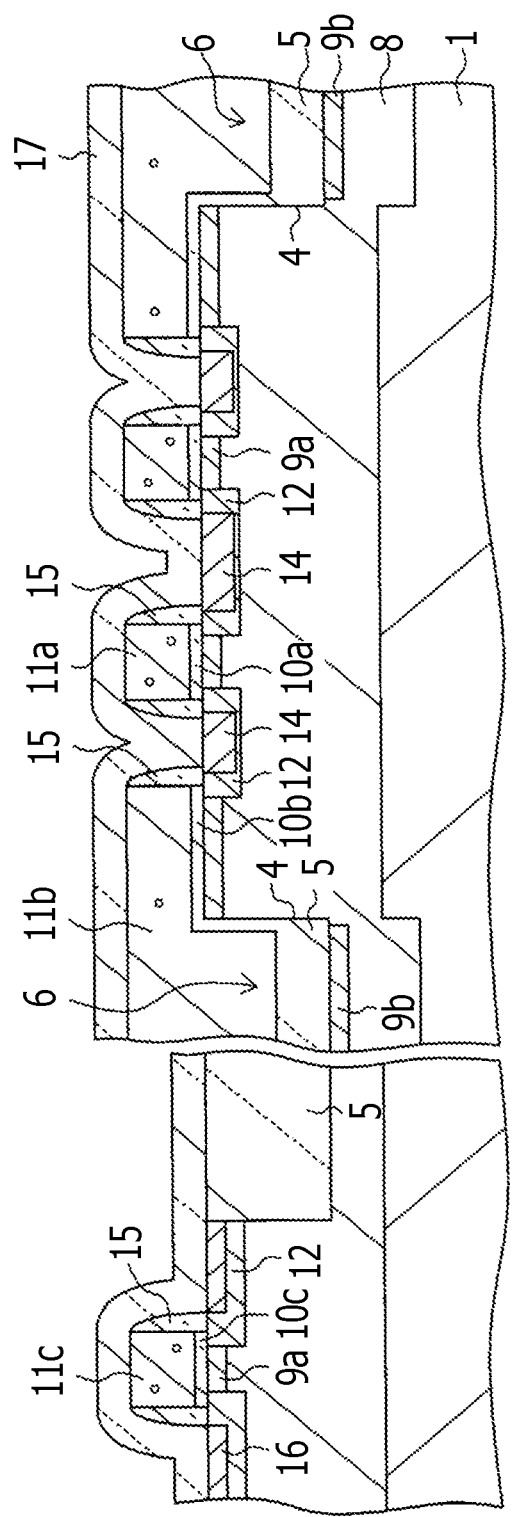

Subsequently, as illustrated in FIG. 4N, an insulating film 17 is formed on the silicon substrate 1 while covering the gate electrodes 11a and 11c, the cell plate electrode 11b, and the side wall insulating films 15 on the side walls thereof. For example, a silicon oxide film having a thickness of 70 nm is accumulated through CVD.

Figure 4O:
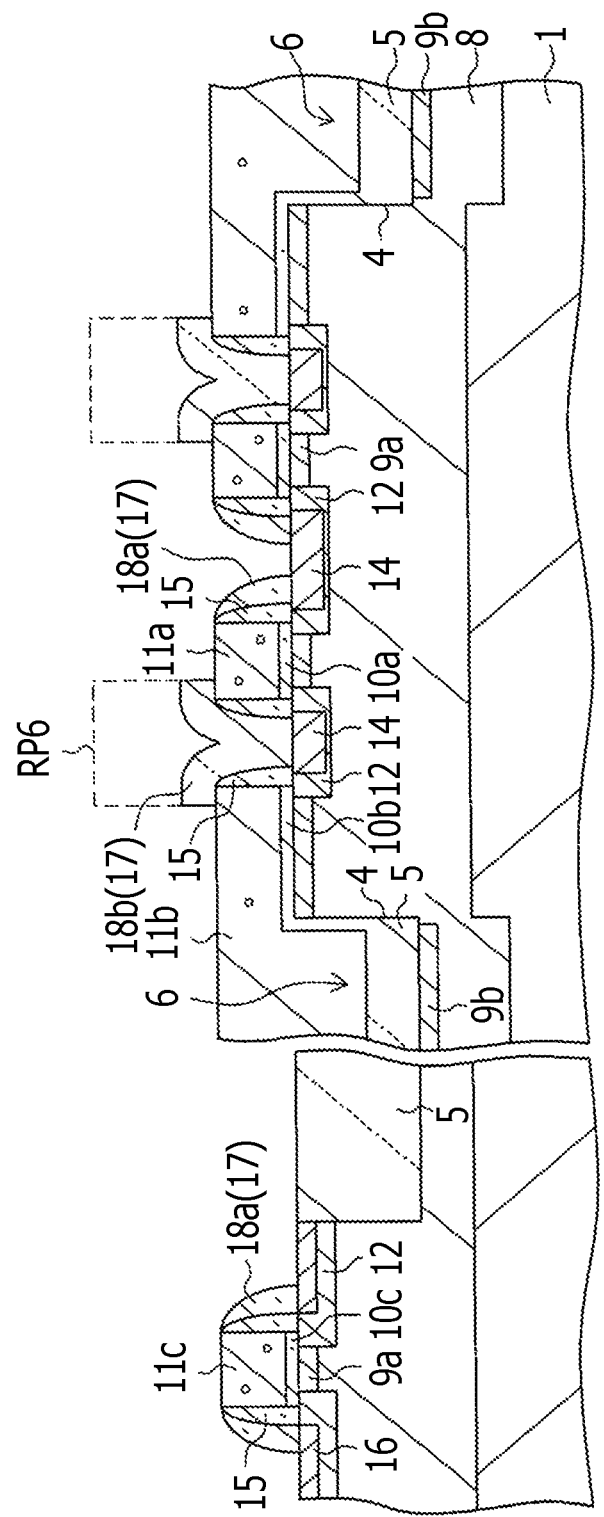

Thereafter, as illustrated in FIG. 4O, a resist pattern RP6 covering regions between the gate electrode 11a of the switching transistor of the memory cell and the cell plate electrode 11b adjacent thereto and exposing a region opposite to the cell plate electrode 11b with respect to the gate electrode 11a and regions on both sides of the gate electrode 11c of the p-type MOS transistor of the logic circuit is formed through lithography.

Then, the insulating film 17 is etched back through anisotropic etching, e.g., reactive ion etching (RIE) by using the resist pattern RP6. In this manner, the insulating film 17 is left on the side wall insulating film 15 on the side wall, which is on the side opposite to the cell plate electrode 11b, of the gate electrode 11a of the switching transistor and the side wall insulating films 15 on both side walls of the gate electrode 11c of the p-type MOS transistor of the logic circuit, so as to form side wall insulating films (side wall spacers) 18a.

Furthermore, at the same time, the insulating film 17 in the region under the resist pattern RP6 and between the gate electrode 11a of the switching transistor and the cell plate electrode 11b is left and, thereby, a mask member 18b covering this region is formed. Thereafter, the resist pattern RP6 is removed by an ashing treatment or the like.

Figure 4P:
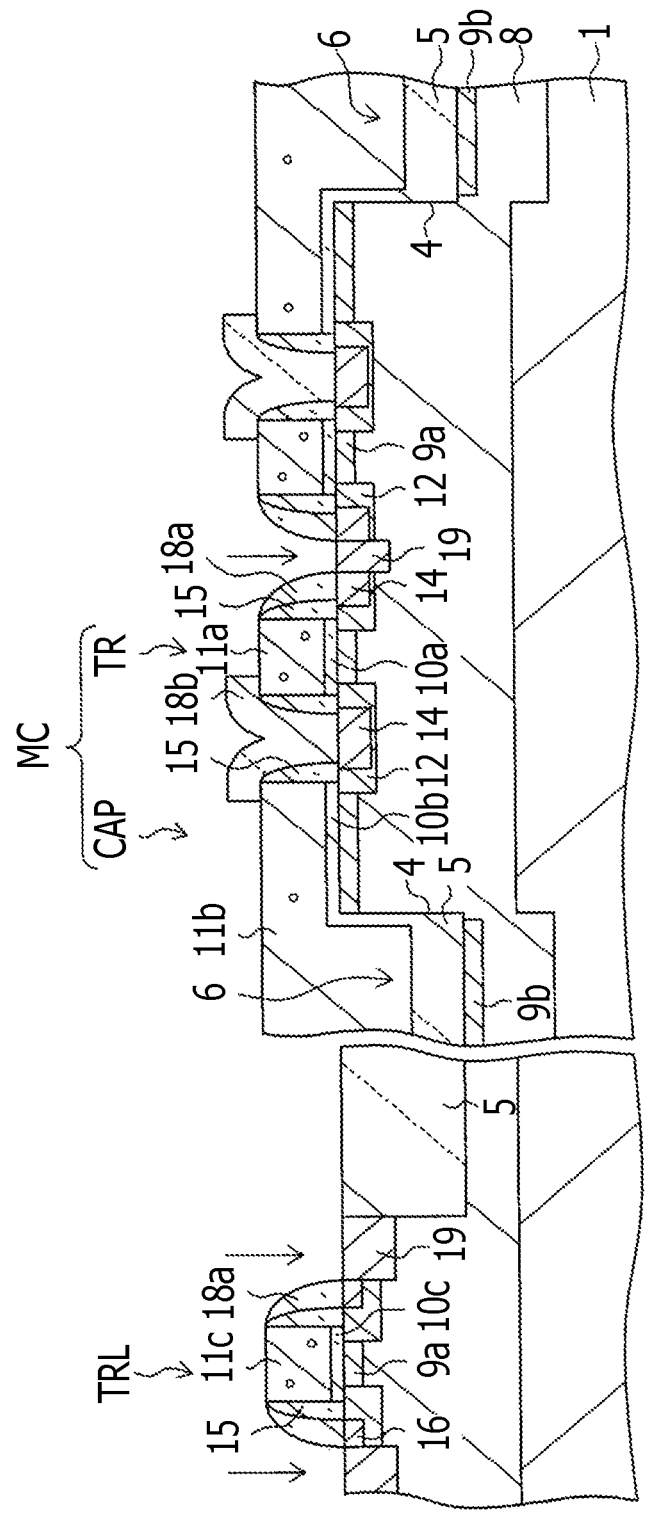

Next, as illustrated in FIG. 4P, ion implantation of a p-type impurity is conducted by using the gate electrode 11a, side wall insulating films 15 and 18a on the side wall, which is on the side opposite to the cell plate electrode 11b, of the gate electrode 11a, the cell plate electrode 11b, the mask member 18b, the gate electrode 11c, and the side wall insulating films 15 and 18a on both side walls of the gate electrode 11c as masks. As for the ion implantation condition, for example, boron (B) is used as the p-type impurity, the acceleration energy is specified to be 4 keV, and the dosage is specified to be $6.0 \times 10^{15}/cm^2$.

Consequently, a region 19 having an impurity concentration higher than that of the extension region 14 is formed on the side, which is opposite to the cell plate electrode 11b, of the gate electrode 11a of the switching transistor in such a way as to be superimposed on the extension region 14.

In this manner, a switching transistor structure TR of the memory circuit is formed including the gate electrode 11a, the gate insulating film 10a, the extension region 14, which is disposed on the cell plate electrode 11b side and which serves as a storage diffusion layer, and the high impurity concentration region 19 (and the extension region 14 superimposed thereon), which is disposed on the side opposite to the cell plate electrode 11b and which serves as a bit contact diffusion layer.

Furthermore, at the same time, source/drain regions 19 having an impurity concentration higher than that of the extension region 16 are formed on both sides of the gate electrode 11c of the p-type MOS transistor of the logic circuit in such a way as to be superimposed on the extension region 16.

In this manner, a p-type MOS transistor TRL of the logic circuit is formed including the gate electrode 11c, the gate insulating film 10c, the source/drain regions 19 (and the extension region 16 superimposed thereon).

A capacitor structure CAP is formed from the cell plate electrode 11b, the capacitor insulating film 10b, which is the upper surface of the silicon substrate 1 and the side surfaces of the capacitor trench 6 and which interposes between the cell plate electrode 11b and the silicon substrate 1, and the surface portion (the inversion layer formed therein) of the silicon substrate 1 opposite to the cell plate electrode 11b with the capacitor insulating film 10b. The memory cell MC is formed including the switching transistor structure TR and the capacitor structure CAP.

After ion implantation for forming the bit contact diffusion layer and the source/drain regions 19, a heat treatment through rapid thermal annealing (RTA) is conducted, for example, at 1,025° C. for 3 seconds for the purpose of activation and diffusion of the impurity.

Subsequently, a Co film is formed through sputtering and a heat treatment is conducted, so as to effect silicidation of the surfaces of the gate electrodes 11a and 11c, the cell plate electrode 11b, and the source/drain regions 19. Thereafter, the Co film of unnecessary portions is removed.

Figure 4Q:
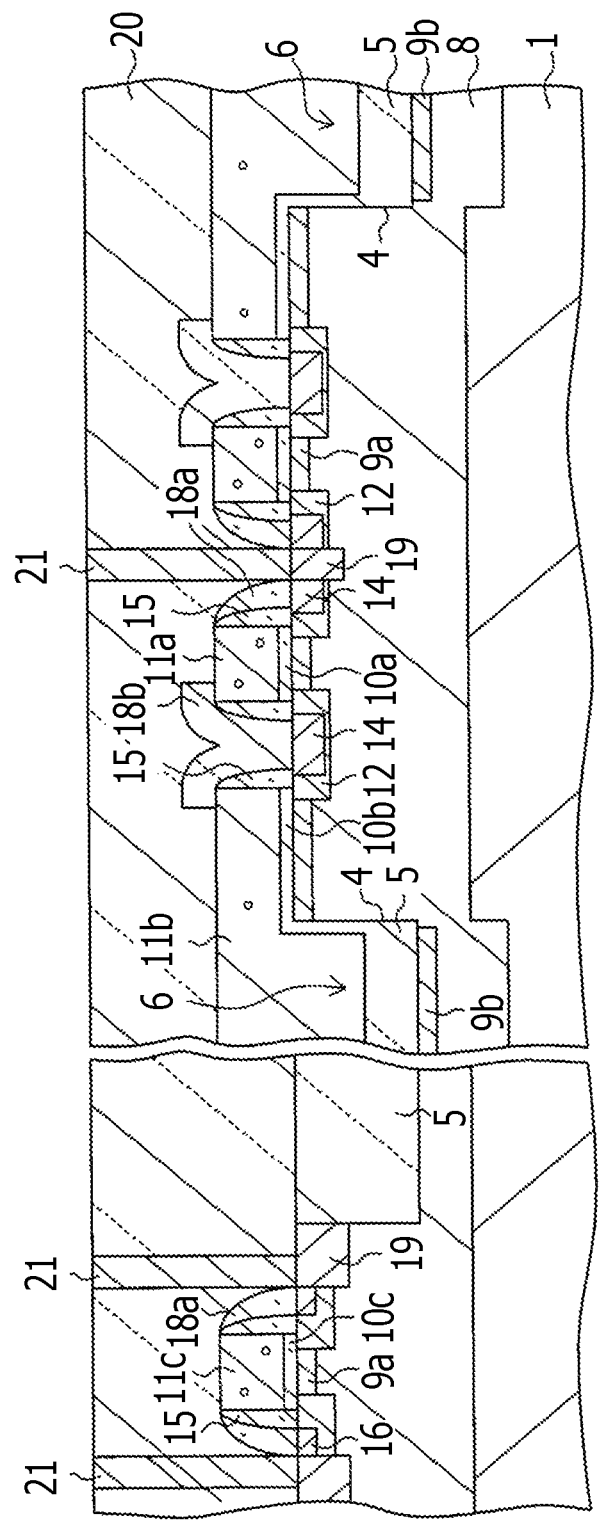

Then, as illustrated in FIG. 4Q, an interlayer insulating film 20 is formed all over the silicon substrate 1 by accumulating a silicon oxide film through, for example, CVD.

Next, the interlayer insulating film 20 is worked through lithography and dry etching in such a way as to expose the bit contact diffusion layer 19 of the memory cell and the source/drain regions 19 of the p-type MOS transistor of the logic circuit, so that contact holes are formed. Thereafter, the resist pattern used in dry etching is removed by an ashing treatment or the like.

Then, contact plugs 21 are formed by forming W plugs containing a glue film in such a way as to fill the contact holes.

Thereafter, Cu wirings and the like are formed by a damascene method or the like. Subsequently, a semiconductor device according to the embodiment is completed through further formation of an interlayer insulating film, an upper wiring, an upper protective film, and the like.

The present inventors found that a reduction in leakage current through the storage diffusion layer STR and the like were facilitated by forming the storage diffusion layer 14 (may be referred to as a storage diffusion layer STR) by ion implantation through the insulating film 13 as described below.

Initially, the experiment on examination of the on-current of a transistor of a memory cell and a leakage current through a storage diffusion layer will be described.

Figure 5A:
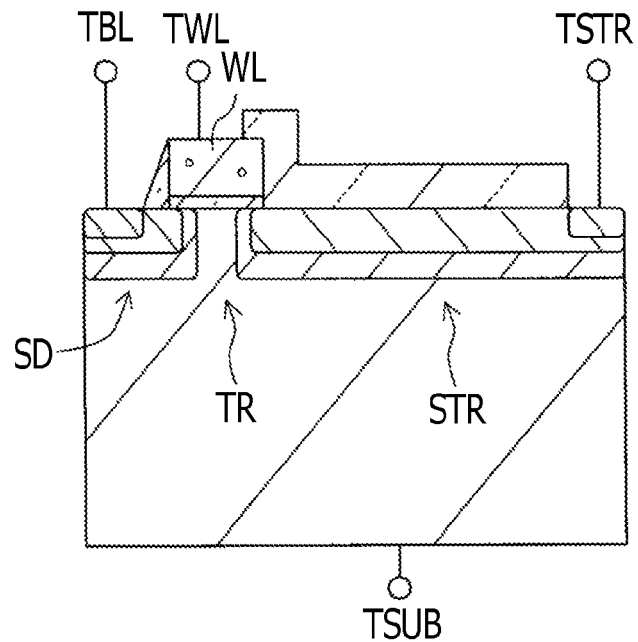
FIGS. 5A and 5B are schematic sectional views illustrating sample structures of experiments, in which the on-current and the leakage current of memory cells according to an embodiment are measured.
Figure 5B:
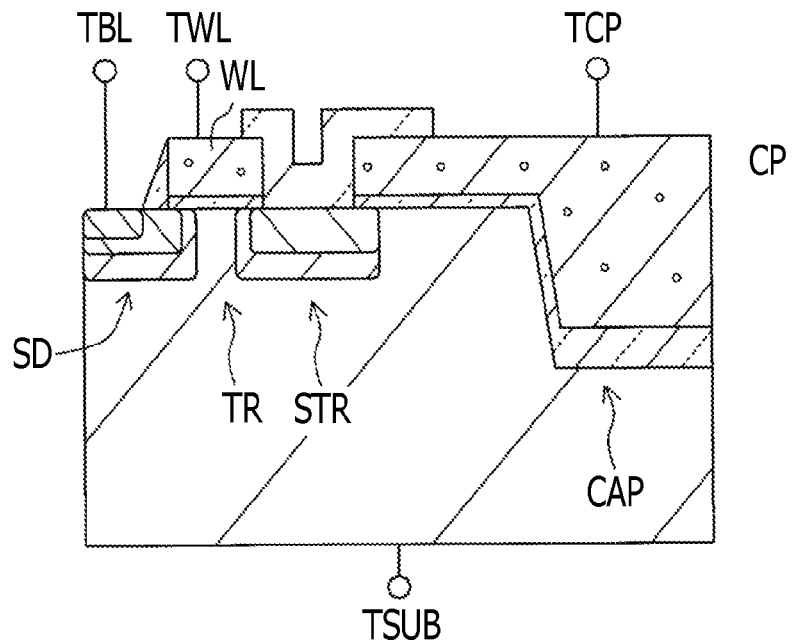

FIGS. 5A and 5B are schematic sectional views illustrating measurement sample structures of this experiment. FIG. 5A illustrates the sample structure related to the on-current measurement. FIG. 5B illustrates the sample structure related to the leakage current measurement.

In the sample structure related to the on-current measurement illustrated in FIG. 5A, a bit line terminal TBL, a word line terminal TWL, and a substrate terminal TSUB were disposed as terminals connected to the bit contact diffusion layer SD, the gate electrode WL, and the substrate, respectively, of the transistor TR of the memory cell. In addition to them, a storage diffusion layer terminal TSTR was disposed as an electrode terminal led from the storage diffusion layer STR. However, no electrode is connected to the storage diffusion layer STR in the actual memory structure. In this regard, the gate length was, for example, 120 nm, and the gate width was, for example, 90 nm.

In the sample structure related to the leakage current measurement illustrated in FIG. 5B, as in the sample for the on-current measurement, a bit line terminal TBL, a word line terminal TWL, and a substrate terminal TSUB were disposed and, in addition, a cell plate electrode terminal TCP connected to the cell plate electrode CP was disposed. In this regard, the gate length was, for example, 100 nm, and the gate width was, for example, 90 nm.

The transistor TR having the sample structure related to the on-current measurement and the transistor TR having the sample structure related to the leakage current measurement were formed at the same time on the same substrate in a manner similar to the production steps in the above-described embodiment.

Ion implantation for forming the storage diffusion layer STR was conducted through an insulating film. As for the insulating film, a silicon oxide film having a thickness of 15 nm was used, and boron (B) was implanted with an acceleration energy of 5.0 keV in a dosage of $4.0 \times 10^{14}/cm^2$.

Regarding pocket implantation in the sample production of this experiment, phosphorus (P) was used, the acceleration energy was specified to be 35 keV, the dosage per time was specified to be $6.1 \times 10^{12}/cm^2$, a wafer was rotated, and 45-degree tilted implantation was conducted from four directions.

Subsequently, a sample of a first comparative embodiment was also prepared. As for the sample of the first comparative embodiment, ion implantation for forming the storage diffusion layer was conducted not through the insulating film, but by using a gate electrode and a cell plate electrode as masks.

As for the ion implantation condition for forming the storage diffusion layer of the first comparative embodiment, as in the formation of the extension region of the p-type MOS transistor of the logic circuit, boron (B) was used, the acceleration energy was specified to be 0.5 keV, and the dosage was specified to be $2.0 \times 10^{14}/cm^2$.

Regarding pocket implantation in the sample production of the first comparative embodiment, phosphorus (P) was used, the acceleration energy was specified to be 35 keV, the dosage per time was specified to be $3.0 \times 10^{12}/cm^2$, a wafer was rotated, and 45-degree tilted implantation was conducted from four directions.

Furthermore, in order that the predetermined threshold voltage Vth (−0.23V) was achieved, besides the logic transistor portion, ion implantation as channel doping was conducted by using arsenic (As) and specifying the acceleration energy to be 60 keV and the dosage to be $4.0 \times 10^{12}/cm^2$.

As for the measurement of the on-current, a current passing the storage diffusion layer terminal TSTR was measured while the voltage applied to the word line terminal TWL was specified to be −1.55 V so that the transistor TR came into the on state, the voltage applied to the bit line terminal TBL was specified to be 0 V, and the voltage applied to storage diffusion layer terminal TSTR was specified to be −1.2V. The voltage applied to the substrate terminal TSUB was specified to be 0 V.

As for the measurement of the leakage current, a current passing the bit line terminal TBL was measured while the voltage applied to the cell plate electrode terminal TCP was specified to be −0.35 V, the voltage applied to the word line terminal TWL was specified to be −0.35 V so that the transistor TR came into the on state, the voltage applied to the substrate terminal TSUB was specified to be 1.2 V, and the voltage applied to the bit line terminal TBL was specified to be 0 V.

Figure 6:
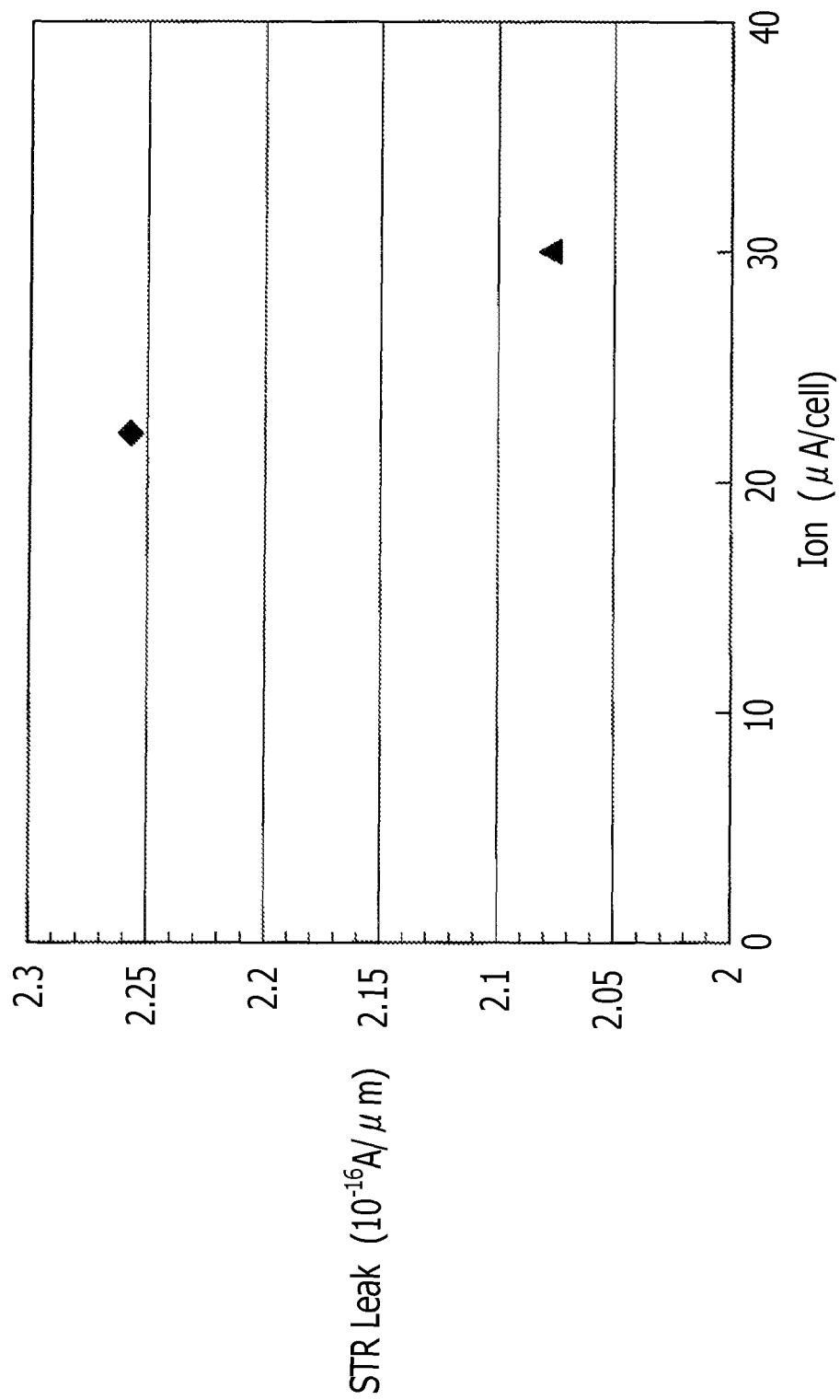
FIG. 6 is a graph, in which the experimental results of measurements of the on-currents and the leakage currents of memory cells according to an embodiment and a first comparative embodiment are plotted.

FIG. 6 is a graph, in which the leakage current versus the on-current is plotted. The horizontal axis indicates the on-current Ion in μA/cell, and the vertical axis indicates the leakage current STR Leak in $10^{-16}$ A/μm. The embodiment is indicated by a triangle plot, and the first comparative example is indicated by a rhombus plot. The measurements of the on-current and the leakage current were conducted at room temperature.

It is preferable that the leakage current is low from the viewpoint of the charge retention characteristic of the memory, and it is preferable that the on-current is high from the viewpoint of, for example, high-speed operation of the switching transistor. In this experiment, the leakage current was low and the on-current was high as compared with those in the first comparative embodiment. In this regard, the results of measurement at room temperature are illustrated in FIG. 6. According to the measurement at high temperatures (for example, 125° C.), the leakage current reduction effect on the basis of the embodiment was more remarkable.

As described above, it was made clear that a reduction in leakage current was facilitated because of formation of the storage diffusion layer by ion implantation through the insulating film. It was also made clear that a reduction in on-current was suppressed.

Next, a simulation for considering an influence of ion implantation through the insulating film exerted on the impurity concentration profile of the storage diffusion layer will be described.

As for the simulation, Technology•Computer•Aided•Design (TCAD) software was used. It was assumed that B as an impurity was implanted through a silicon oxide film, the depth direction profile of B (hereafter may be referred to as a B profile) was gained at the center portion of the storage diffusion layer. The thickness of the silicon oxide film was changed from 5 nm to 10 nm, 15 nm, and 20 nm.

Furthermore, a simulation with respect to a second comparative embodiment was conducted, wherein an insulating film covering a portion between a gate electrode and a cell plate electrode was etched back so as to bring about the state, in which side walls were left on the gate electrode side walls and the cell plate electrode side walls, as in the embodiment, and ion implantation was conducted through the side walls. Regarding the second comparative embodiment, at the center portion of the storage diffusion layer, the insulating film was removed and, therefore, ion implantation was conducted without the insulating film present.

Figure 7:
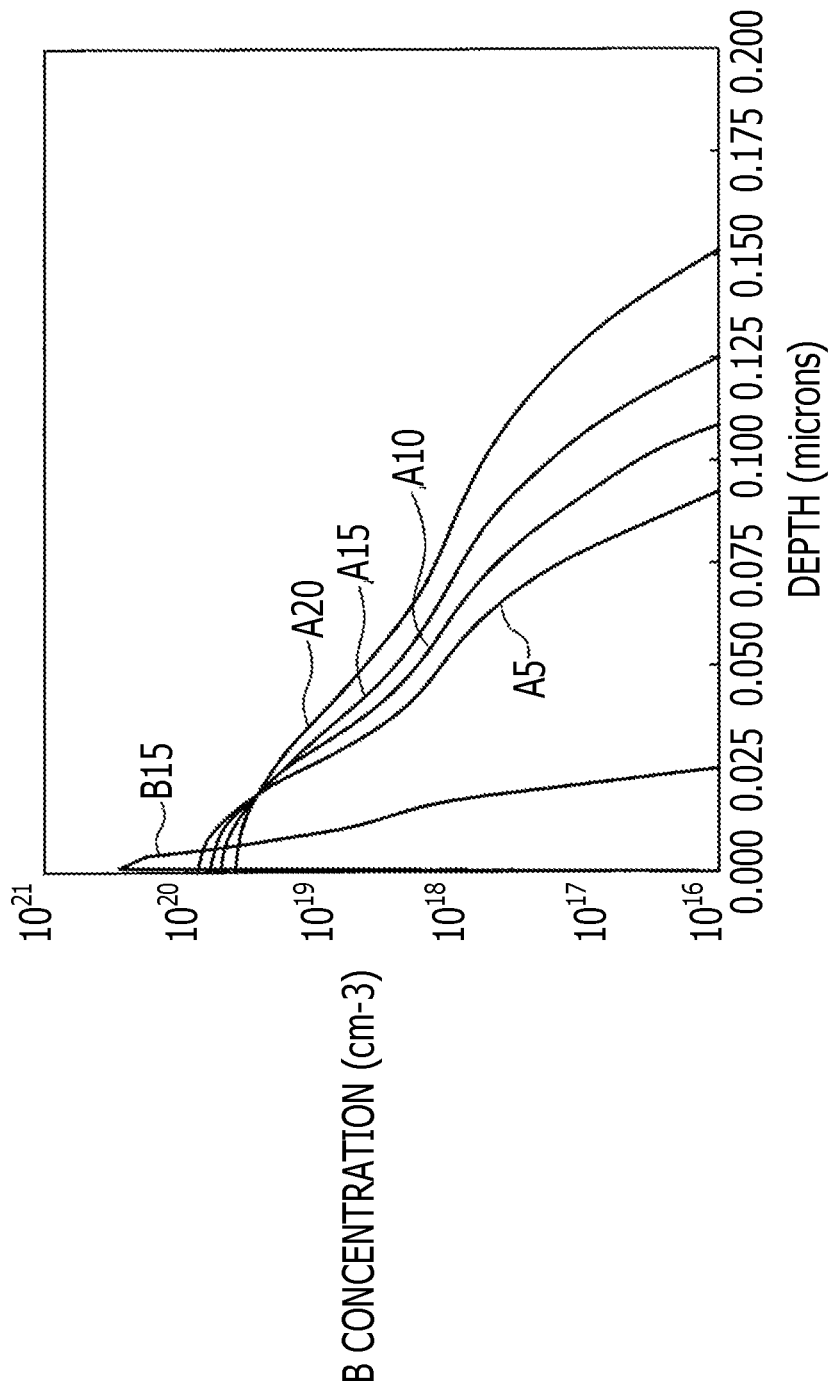
FIG. 7 illustrates depth-direction profiles of an impurity obtained by simulation with respect to an embodiment and a second comparative embodiment.

FIG. 7 illustrates a depth-direction profile, which is obtained by simulation, of B as the impurity immediately after implantation of B as the impurity in the embodiment and the second comparative embodiment. The horizontal axis indicates the depth in μm from the silicon substrate surface, and the vertical axis is in a log scale and indicates the B concentration in $cm^{-3}$.

Curves A5, A10, A15, and A20 represent the B profiles of the embodiment, in which the thicknesses of the insulating films were 5 nm, 10 nm, 15 nm, and 20 nm, respectively. A curve B15 represents the B profile of the second comparative embodiment, in which the thickness of the side wall was 15 nm.

The acceleration energy of each sample was adjusted in such a way as to equalize the projection ranges Rp, which are the depths corresponding to the peak concentrations of the profiles. The projection ranges Rp of the profiles illustrated in FIG. 7 are 0.7 nm. In this regard, the dosages of all samples were equal and were $2.0 \times 10^{14}/cm^2$.

The acceleration energy of the samples having the insulating film thickness of 5 nm, 10 nm, 15 nm, and 20 nm of the embodiment were 3 keV, 4 keV, 5 keV, and 7 keV, respectively. The acceleration energy of the sample having the thickness of the side wall of 15 nm of the second comparative embodiment was 0.5 keV. In order to obtain the same level of projection range Rp, in the embodiment, in which ion implantation is conducted through the insulating film, the acceleration energy higher than that in the second comparative embodiment without the insulating film is required. Furthermore, higher acceleration energy is required as the thickness of the insulating film, through which an impurity passes, increases.

In the second comparative embodiment, B as the impurity is distributed in a shallow portion of the substrate surface in a concentrated way. The peak concentration exhibited in the vicinity of the projection range Rp (depth 0.7 nm) exceeds $10^{20}$ $cm^{-3}$ and, therefore, is high. The deepest implantation depth is about 25 nm and, therefore, is small.

In the embodiment, B as the impurity is distributed while spreading to a deeper portion as compared with that in the second comparative embodiment. The peak concentration exhibited in the vicinity of the projection range Rp (depth 0.7 nm) of every sample is on the order of $10^{19}$ $cm^{-3}$ and, therefore, is low, and the tail of the distribution spreads to a depth portion exceeding 90 nm. As the film thickness of the insulating film becomes larger and the acceleration energy becomes higher, the peak concentration becomes lower and, in addition, the deepest implantation depth tends to become larger. In this regard, in the embodiment, some amount of B as the impurity does not go across the insulating film and remains within the thickness of the insulating film.

As described above, in the present embodiment, in order to implant the impurity across the insulating film into the substrate sufficiently, ion implantation utilizing higher acceleration energy (for example, 6 times to 14 times that in the case without the insulating film) is preferable. Along with ion implantation through insulating film with relatively high acceleration energy, the peak concentration of the impurity profile is reduced and, thereby, the impurity concentration is reduced on the whole and the tail of the distribution reaches a greater depth.

Incidentally, it may also be said that the second comparative embodiment corresponds to extension implantation of the p-type MOS transistor of the logic. As explained in the above-described production steps, the extension implantation of the switching transistor of the memory cell is conducted through the insulating film and, thereafter, this insulating film is etched back, so as to leave side walls on the gate electrode side walls of the p-type MOS transistor of the logic. Subsequently, extension implantation of the p-type MOS transistor of the logic is conducted through the resulting side walls.

The extension implantation of the switching transistor of the memory cell is conducted through a silicon oxide film having a thickness of, for example, 15 nm by using B as an impurity and specifying the acceleration energy to be 5.0 keV and the dosage to be $4.0 \times 10^{14}/cm^2$.

On the other hand, the extension implantation of the p-type MOS transistor of the logic is conducted through side walls by, for example, using B as an impurity and specifying the acceleration energy to be 0.5 keV and the dosage to be $2.0 \times 10^{14}/cm^2$.

It may roughly be said that this corresponds to the situation illustrated in FIG. 7, and it is said that the storage diffusion layer (extension region) of the switching transistor of the memory cell has a low impurity concentration and is formed deeply as compared with the extension region of the p-type MOS transistor of the logic. In this regard, the extension region of the transistor of the logic is required to be formed shallowly for the purpose of suppressing a short channel effect.

From the above-described consideration, it is believed that regarding the memory cell formed by the method according to the embodiment, the impurity concentration of the storage diffusion layer of the switching transistor is reduced to a low level and, thereby, a junction leakage current through the storage diffusion layer is suppressed.

Furthermore, it is believed that the storage diffusion layer is formed deeply and, thereby, the on-current of the switching transistor increases easily.

The simulation, in which the acceleration energy of the samples having the insulating film thicknesses of 5 nm, 10 nm, 15 nm, and 20 nm of the embodiment were specified to be 3 keV, 4 keV, 5 keV, and 7 keV, respectively, for the purpose of equalizing the projection ranges Rp to 0.7 nm, has been explained.

The present inventors further conducted a simulation, in which the projection ranges Rp of the samples in the embodiment were changed.

A simulation, in which the acceleration energy of the samples having an insulating film thicknesses of 10 nm, 15 nm, and 20 nm were specified to be 5.5 keV, 7 keV, and 8.3 keV, respectively, for the purpose of equalizing the projection ranges Rp to 5.2 nm, was conducted.

Moreover, a simulation, in which the acceleration energy of the samples having an insulating film thicknesses of 10 nm, 15 nm, and 20 nm were specified to be 7.8 keV, 9 keV, and 10.5 keV, respectively, for the purpose of equalizing the projection ranges Rp to 14.3 nm, was conducted.

In addition, a simulation, in which the acceleration energy of the samples having an insulating film thicknesses of 10 nm, 15 nm, and 20 nm were specified to be 9.3 keV, 11 keV, and 12 keV, respectively, for the purpose of equalizing the projection ranges Rp to 22.5 nm, was conducted.

Subsequently, regarding each of these conditions, the on-current of the transistor of the memory cell and the leakage current through the storage diffusion layer were evaluated on the basis of the simulation.

In the measurement of the on-current and the leakage current, an electrode connected to the storage diffusion layer was disposed. As for the measurement of the on-current, the gate electrode potential was specified to be −1.2 V, which was an on-level of the transistor, the potential of the bit contact diffusion layer was specified to be 0.0 V, and the potential of the storage diffusion layer was specified to be −1.2 V, so as to evaluate the current passing from the bit contact diffusion layer to the storage diffusion layer side. The substrate potential was specified to be 0.0 V.

As for the measurement of the leakage current, the cell plate electrode potential was specified to be −1.55 V, the gate electrode potential was specified to be 0.35 V, which was an off-level of the transistor, and the potential of the bit contact diffusion layer was specified to be open. The potential of the storage diffusion layer electrode was specified to be −1.55 V, and the substrate potential was specified to be 0 V, so as to evaluate the current passing from the storage diffusion layer to the well side of the substrate.

Furthermore, regarding the first comparative embodiment, in which impurity implantation was conducted without an insulating film (and a side wall), the on-current and the leakage current were evaluated on the basis of a simulation.

Figure 8:
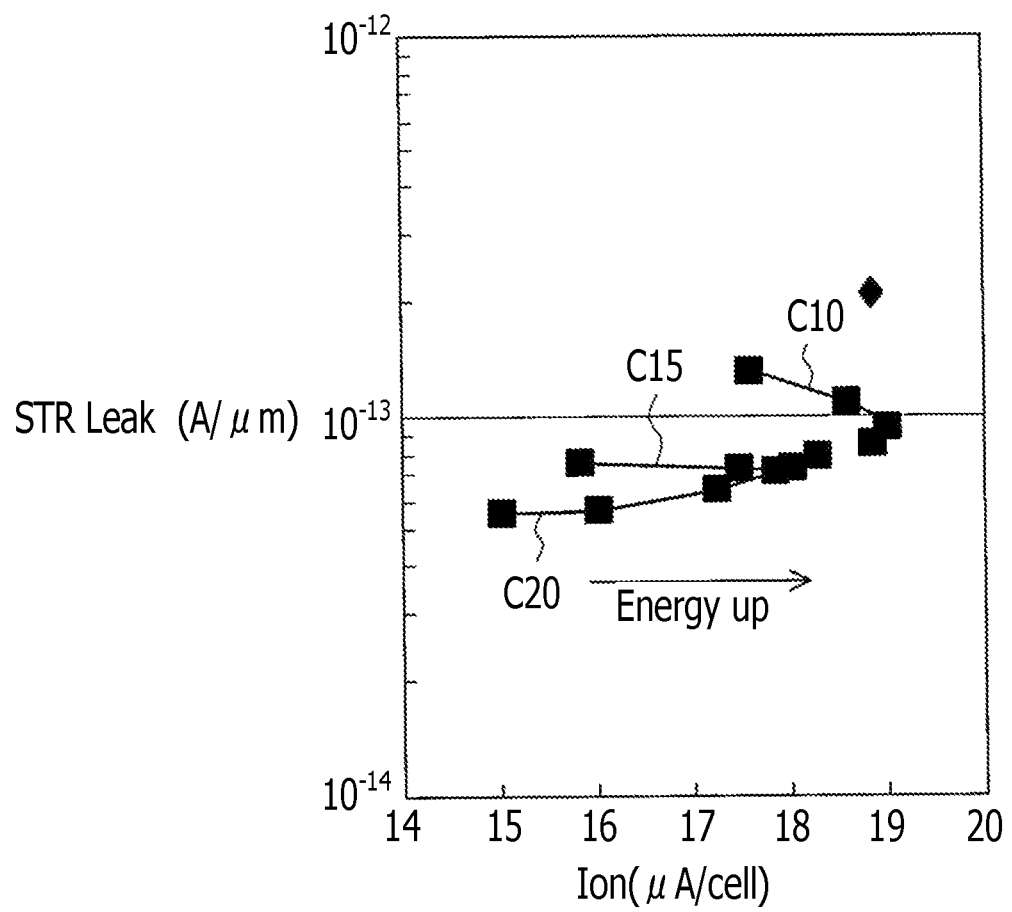
FIG. 8 is a graph, in which the simulation results of the on-currents and the leakage currents of memory cells according to an embodiment and a first comparative embodiment are plotted.

FIG. 8 is a graph, in which the leakage current versus the on-current is plotted. The horizontal axis indicates the on-current Ion in μA/cell, and the vertical axis is in a log scale and indicates the leakage current STR Leak in A/μm. The embodiment is indicated by square plots, and curves C10, C15, and C20 represent the results of samples, in which the film thicknesses of the insulating films are 10 nm, 15 nm, and 20 nm, respectively, of the embodiment. Regarding each insulating film thickness, four plots are illustrated, where the projection range is changed (acceleration energy is changed). In this regard, the first comparative example is indicated by a rhombus plot.

Regarding the simulation as well, the leakage current of the embodiment was reduced as compared with that of the first comparative embodiment. However, regarding the samples of the embodiment, as the insulating film thickness increases, the leakage current is reduced, but it is observed that the on-current tends to be reduced.

In consideration of this, it is believed to be preferable that the thickness of the insulating film used for impurity implantation in the formation of the storage diffusion layer is specified to be, for example, 20 nm or less. In this regard, if the thickness of the insulating film is too small, a desired effect is not obtained easily. Consequently, it is preferable that the thickness is specified to be, for example, 5 nm or more.

Moreover, regarding each insulating film thickness, it is observed that the on-current tends to increase as the acceleration energy increases. That is, it is indicated that an increase in acceleration energy is effective for suppressing a reduction in on-current. However, resulting from, for example, an increase in diffusion in a lateral direction along with an increase in acceleration energy, it becomes difficult to match the behavior of a simulation with that of an actual sample. The establishment of technology to increase an on-current on the basis of an increase in acceleration energy is desirable.

As described above, a reduction in junction leakage current through the storage diffusion layer is facilitated by forming the storage diffusion layer of the switching transistor of the memory cell by impurity implantation through the insulating film. Consequently, the charge retention characteristic of the memory is improved.

This insulating film may be used as, for example, a mask for high-concentration impurity implantation of the bit contact region of the switching transistor by being left as a side wall spacer on the gate electrode side wall of the switching transistor.

This insulating film may be used as, for example, a mask for extension implantation of the transistor of the logic by being left as a side wall spacer on the gate electrode side wall of the transistor of the logic.

Incidentally, an embodiment, in which the switching transistor of the memory cell is specified to be the p-type transistor, has been explained. However, it is believed that the effect of suppressing a leakage current based on the formation of the storage diffusion layer by the impurity implantation through the insulating film is exerted likewise even when the electrical conduction type is inverted so as to form an n-type transistor. In this regard, the switching transistor of the memory cell may have a structure in which the p-type and the n-type are present together.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that various changes, substitutions, and alterations could be made hereto without departing from the spirit and scope of the invention.

What is claimed is:

1. A method for manufacturing a semiconductor device, comprising:
   preparing a semiconductor substrate having a first region and a second region as a part of a surface layer of the semiconductor substrate, the first region and the second region being a first electrical conduction type, the first region and the second region being isolated by an element isolation insulating film, a first gate electrode and a capacitor structure being disposed on the first region, a second gate electrode being disposed on the second region, the first region not including an area on the element isolation insulating film;
   forming a first insulating film covering the first gate electrode, the second gate electrode, and the capacitor structure and covering the surface of the semiconductor substrate;
   forming a first mask covering the second gate electrode and a third region, the third region being around the second gate electrode in the surface layer of the semiconductor substrate;
   implanting a first impurity of a second electrical conduction type into the semiconductor substrate, so as to form a doped region of the second electrical conduction type in each of a fourth region and a fifth region in the surface layer of the semiconductor substrate, the fourth region being a region between the first gate electrode and the capacitor structure, the fifth region being a region opposite to the capacitor structure with the first gate electrode therebetween;
   removing the first mask, so as to expose the first insulating film present under the first mask;

forming first side walls on the first gate electrode and forming second side walls on the second gate electrode by etching the first insulating film; and implanting a second impurity of the second electrical conduction type into the third region after forming a second mask covering the fourth region and the fifth region.

2. The method for manufacturing a semiconductor device according to claim 1, wherein after the implanting a second impurity, the method further comprising: forming a second insulating film covering the first gate electrode provided with the first side walls and the capacitor structure and covering the surface of the semiconductor substrate; and leaving a second insulating portion on the first side walls by etching the second insulating film.

3. The method for manufacturing a semiconductor device according to claim 2, wherein the second insulating portion covers the first gate electrode provided with the first side walls, and the capacitor structure and covers the surface of the semiconductor substrate.

4. The method for manufacturing a semiconductor device according to claim 1, wherein the peak concentration of a depth-direction profile of the first impurity is lower than the peak concentration of a depth-direction profile of the second impurity.

5. The method for manufacturing a semiconductor device according to claim 4, wherein the deepest position of a depth-direction profile of the first impurity is deeper than the deepest position of a depth-direction profile of the second impurity.

6. The method for manufacturing a semiconductor device according to claim 4, wherein the acceleration energy of the first impurity in the implanting of the first impurity is within the range of 6 times to 14 times the acceleration energy of the second impurity in the implanting of the second impurity.

7. The method for manufacturing a semiconductor device according to claim 4, wherein the first impurity and the second impurity are the same type of impurity.

8. The method for manufacturing a semiconductor device according to claim 1, wherein the first insulating film is formed having a thickness within the range of 5 nm to 20 nm.

9. The method for manufacturing a semiconductor device according to claim 8, wherein the material for the first insulating film is silicon oxide.

10. The method for manufacturing a semiconductor device according to claim 1, wherein before the forming of the first insulating film, the method further comprising: implanting a fourth impurity of the first electrical conduction type into the second region and the third region slantingly while the first gate electrode and the capacitor structure are masked.

11. The method for manufacturing a semiconductor device according to claim 10, wherein the fourth impurity is implanted into the semiconductor substrate slantingly from a plurality of directions by rotating the semiconductor substrate.

12. The method for manufacturing a semiconductor device according to claim 1, wherein a part of the capacitor structure is provided on the first region and a remaining part of the capacitor structure is provided on the element isolation insulating film.

13. A method for manufacturing a semiconductor device, comprising:

preparing a semiconductor substrate having a first region of a first electrical conduction type as a part of a surface layer of the semiconductor substrate and a first gate electrode and a capacitor structure, the first gate electrode and the capacitor structure being disposed on the first region;

forming a first insulating film covering the first gate electrode and the capacitor structure, the first insulating film covering the surface of the semiconductor substrate;

implanting a first impurity of a second electrical conduction type into the semiconductor substrate, so as to form a region of the second electrical conduction type in each of a second region and a third region in the surface layer of the semiconductor substrate, the second region being a region between the first gate electrode and the capacitor structure, the third region being a region opposite to the capacitor structure with the first gate electrode therebetween; and forming first side walls on the first gate electrode by etching the first insulating film, wherein the semiconductor substrate is further provided with an element isolation groove as a lower portion of the capacitor structure, and the capacitor structure is formed on the semiconductor substrate while extending from the element isolation groove to the first gate electrode side.

14. The method for manufacturing a semiconductor device according to claim 13, wherein the semiconductor substrate is further provided with a sixth region, which is formed opposing to the first gate electrode with the element isolation groove therebetween and which is of the first electrical conduction type, a third gate electrode is formed on the sixth region, and the capacitor structure is formed on the semiconductor substrate while extending from the element isolation groove to the third gate electrode side.

15. The method for manufacturing a semiconductor device according to claim 13, wherein a part of the capacitor structure is provided on the first region and a remaining part of the capacitor structure is provided on the element isolation insulating film.

* * * * *